United States Patent
Jo et al.

(10) Patent No.: US 10,686,027 B2
(45) Date of Patent: Jun. 16, 2020

(54) ELECTRONIC PANEL, DISPLAY DEVICE, AND METHOD FOR MANUFACTURING THE DISPLAY DEVICE

(71) Applicant: Samsung Display Co., Ltd., Yongin-Si, Gyeonggi-Do (KR)

(72) Inventors: Jungyun Jo, Namyangju-si (KR); Byoungyong Kim, Seoul (KR); Seung-soo Ryu, Hwaseong-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 10 days.

(21) Appl. No.: 16/108,584

(22) Filed: Aug. 22, 2018

(65) Prior Publication Data

US 2019/0096979 A1 Mar. 28, 2019

(30) Foreign Application Priority Data

Sep. 26, 2017 (KR) .................. 10-2017-0124503

(51) Int. Cl.

| H01L 27/32 | (2006.01) |
| H01L 51/52 | (2006.01) |
| G09G 3/3266 | (2016.01) |
| G09G 3/3275 | (2016.01) |
| H01L 27/12 | (2006.01) |
| H05K 1/11 | (2006.01) |

(Continued)

(52) U.S. Cl.
CPC ....... *H01L 27/3276* (2013.01); *G09G 3/3233* (2013.01); *G09G 3/3266* (2013.01); *G09G 3/3275* (2013.01); *H01L 27/124* (2013.01); *H01L 27/3258* (2013.01); *H01L 51/5237* (2013.01); *H05K 1/118* (2013.01); *H05K 1/189* (2013.01); *H01L 27/323* (2013.01)

(58) Field of Classification Search
None
See application file for complete search history.

(56) References Cited

U.S. PATENT DOCUMENTS

| 6,195,148 B1 * | 2/2001 | Sasuga ............... G02F 1/133308 349/149 |
| 6,515,720 B1 * | 2/2003 | Iizuka ............... G02F 1/136213 349/110 |

(Continued)

FOREIGN PATENT DOCUMENTS

KR 101741820 B1 5/2017

*Primary Examiner* — Nicholas J Lee
(74) *Attorney, Agent, or Firm* — Cantor Colburn LLP

(57) ABSTRACT

A display device includes a substrate including a display area and a non-display area, driving elements disposed in the display area, a plurality of pads disposed in the non-display area and electrically connected to the driving elements, an insulating layer partially disposed on the pads to partially expose the pads, a plurality of signal pads disposed on the pads exposed by the insulating layer and electrically connected to the pads, respectively, and an electronic component including a plurality of driving bumps disposed on the signal pads and electrically connected to the signal pads, respectively. A first portion of a first driving bump of the driving bumps is in direct contact with a first signal pad of the signal pads, and a second portion of the first driving bump is in direct contact with a portion of the insulating layer not overlapping with the first signal pad.

20 Claims, 27 Drawing Sheets

(51) Int. Cl.
*H05K 1/18* (2006.01)
*G09G 3/3233* (2016.01)

(56) References Cited

U.S. PATENT DOCUMENTS

| | | | | |
|---|---|---|---|---|
| 7,251,007 | B2 * | 7/2007 | Ashizawa | G02F 1/134363 |
| | | | | 349/110 |
| 7,439,939 | B2 * | 10/2008 | Yun | G02F 1/13452 |
| | | | | 345/1.1 |
| 7,903,207 | B2 * | 3/2011 | Lee | G02F 1/133514 |
| | | | | 349/106 |
| 8,817,217 | B2 * | 8/2014 | Kwak | G02F 1/1345 |
| | | | | 349/149 |
| 9,041,869 | B2 * | 5/2015 | Kim | G02F 1/136286 |
| | | | | 349/12 |
| 9,647,243 | B2 * | 5/2017 | Hong | G02F 1/13452 |
| 2006/0071971 | A1 * | 4/2006 | Mori | B41J 2/14072 |
| | | | | 347/44 |
| 2007/0045841 | A1 * | 3/2007 | Cho | H01L 24/83 |
| | | | | 257/737 |
| 2007/0097278 | A1 * | 5/2007 | Rho | G06F 3/044 |
| | | | | 349/12 |
| 2007/0103028 | A1 * | 5/2007 | Lewis | B81B 7/0006 |
| | | | | 310/300 |
| 2007/0268442 | A1 * | 11/2007 | Oh | G02F 1/136204 |
| | | | | 349/149 |
| 2008/0129717 | A1 * | 6/2008 | Lee | G09G 3/3677 |
| | | | | 345/204 |
| 2011/0279023 | A1 * | 11/2011 | Nishioka | H01L 27/3253 |
| | | | | 313/504 |
| 2013/0271388 | A1 * | 10/2013 | Chu | G06F 3/0412 |
| | | | | 345/173 |
| 2014/0043308 | A1 * | 2/2014 | Lee | G09G 3/3677 |
| | | | | 345/205 |
| 2015/0230337 | A1 * | 8/2015 | Kim | H05K 1/118 |
| | | | | 361/751 |
| 2015/0234425 | A1 * | 8/2015 | Kim | G02F 1/136286 |
| | | | | 345/174 |
| 2016/0052081 | A1 | 2/2016 | Regenberg | |
| 2016/0100483 | A1 * | 4/2016 | Hwang | H05B 33/06 |
| | | | | 313/505 |
| 2016/0218153 | A1 * | 7/2016 | Kim | H01L 27/323 |
| 2016/0226030 | A1 * | 8/2016 | Heo | H01L 27/3269 |
| 2017/0317153 | A1 * | 11/2017 | Shin | H01L 24/81 |
| 2018/0120975 | A1 * | 5/2018 | Kim | G06F 3/04164 |

\* cited by examiner

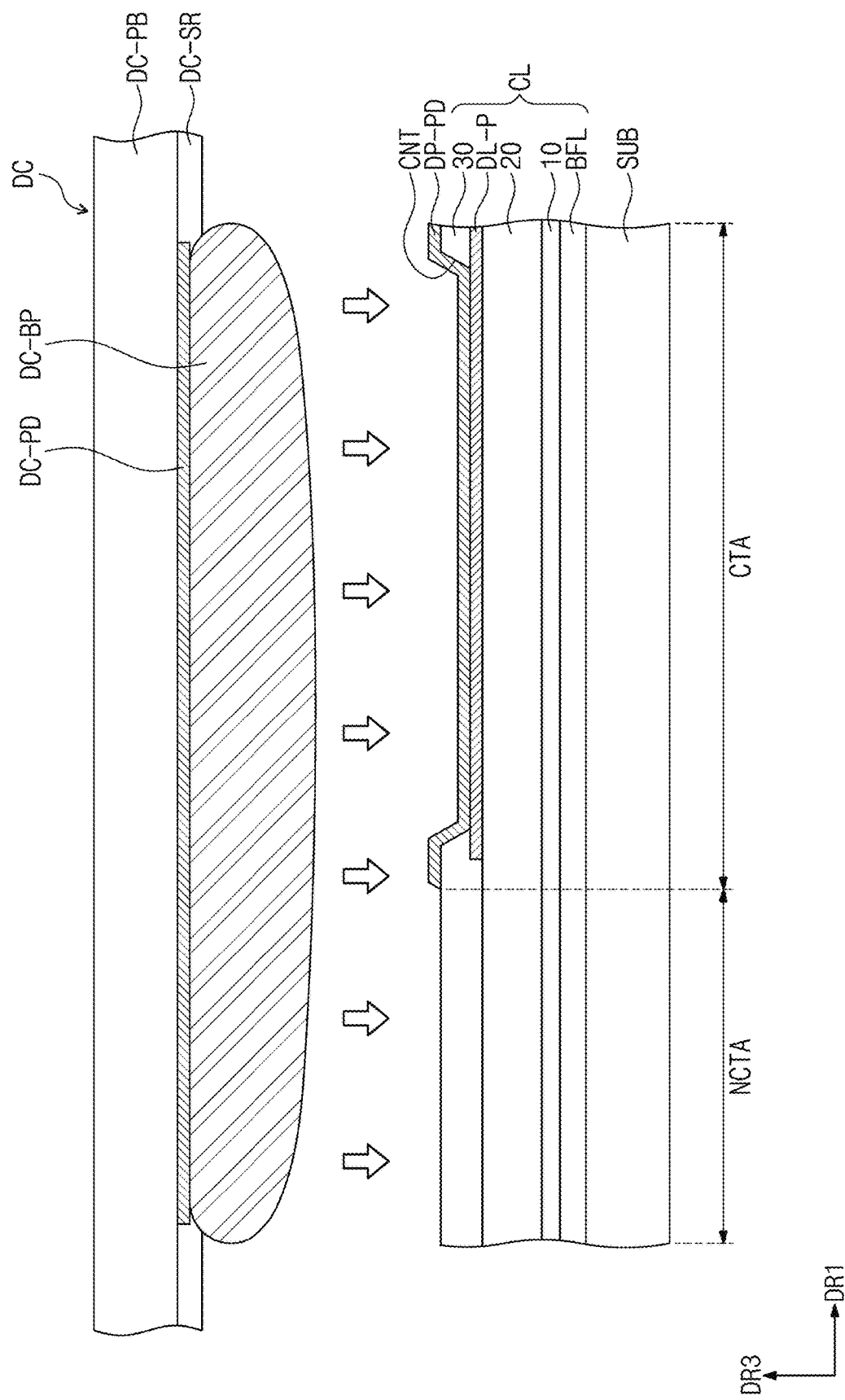

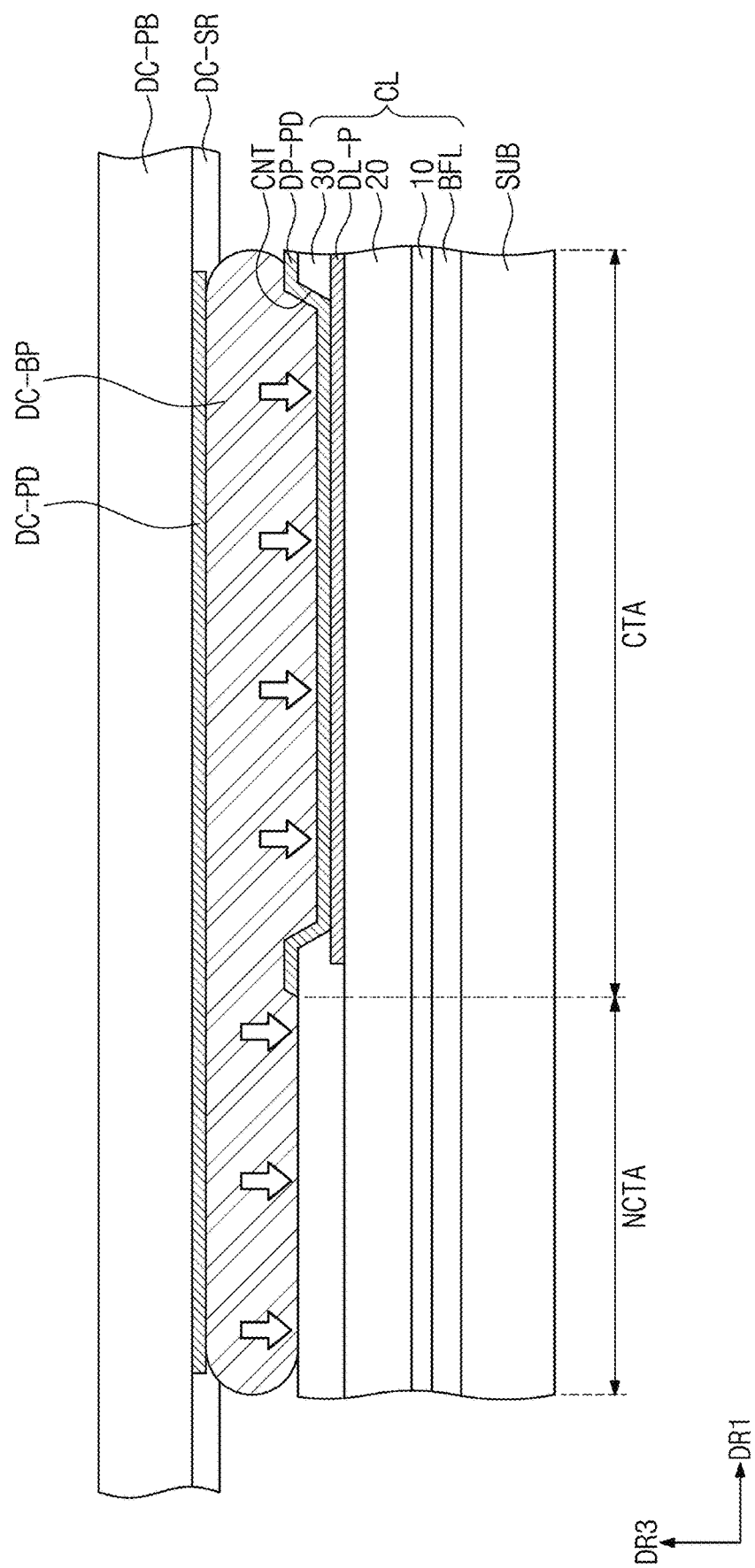

ELECTRONIC PANEL, DISPLAY DEVICE, AND METHOD FOR MANUFACTURING THE DISPLAY DEVICE

This application claims priority to Korean Patent Application No. 10-2017-0124503, filed on Sep. 26, 2017, and all the benefits accruing therefrom under 35 U.S.C. § 119, the content of which in its entirety is herein incorporated by reference.

BACKGROUND

1. Field

Embodiments of the invention relate to a display device and, more particularly, to an electronic panel, a display device, and a method for manufacturing the display device.

2. Description of the Related Art

Various display devices used in multimedia devices such as televisions, portable phones, tablet computers, navigation systems, and game consoles have been developed.

A display device typically includes a display panel for displaying an image. The display panel includes a plurality of gate lines, a plurality of data lines, and a plurality of pixels connected to the plurality of gate lines and the plurality of data lines. The display device may further include an electronic component that is connected to the display panel to provide electrical signals used for displaying an image to the gate lines or the data lines.

SUMMARY

In a display device, an electronic component may be mounted on a display panel by a method using an anisotropic conductive film or an ultrasonography method. A method for connecting the display panel to the electronic component by the ultrasonography method may increase conductivity and may reduce manufacturing processes, as compared with the method using the anisotropic conductive film.

Embodiments of the invention may provide a method for connecting an electronic component and an electronic panel by using an ultrasonography method, an electronic panel capable of checking a bonding strength between the electronic component and the electronic panel, a display device, and a method for manufacturing the display device.

In an embodiment of the invention, a display device includes a substrate including a display area and a non-display area, driving elements disposed in the display area, a plurality of pads disposed in the non-display area and electrically connected to the driving elements, an insulating layer disposed on the pads, where each of the pads is partially exposed through the insulating layer, a plurality of signal pads disposed on the pads exposed by the insulating layer and electrically connected to the pads, respectively, and an electronic component including a plurality of driving bumps disposed on the signal pads, respectively, where each of the signal pads is electrically connected to a corresponding pad among the pads. In such an embodiment, a first portion of a first driving bump of the driving bumps is in direct contact with a first signal pad of the signal pads, and a second portion of the first driving bump is in direct contact with a portion of the insulating layer not overlapping with the first signal pad.

In an embodiment, the first driving bump may be aligned with the first signal pad in such a way that an area of the first driving bump not overlapping with the first signal pad is in a range from about 10% to about 90% of a total area of the first driving bump in a plan view.

In an embodiment, the first driving bump may be aligned with a first pad of the pads in such a way that an area of the first driving bump not overlapping with the first pad is in a range from about 10% to about 90% of a total area of the first driving bump in a plan view.

In an embodiment, the display device may further include another insulating layer disposed between the pads and the substrate.

In an embodiment, the display device may further include another insulating layer disposed between a first pad of the pads and a second pad of the pads.

In an embodiment, a structure each of the signal pads may be the same as a structure of the first signal pad.

In an embodiment, the signal pads may further include a second signal pad in direct contact with both a first portion and a second portion of a second driving bump of the driving bumps.

In an embodiment, the signal pads may further include a third signal pad and a fourth signal pad, and the first to fourth signal pads may be sequentially arranged. In such an embodiment, a structure of the third signal pad may be the same as a structure of the first signal pad, and a structure of the fourth signal pad may be the same as a structure of the second signal pad.

In an embodiment, a first pad of the pads may overlap with the first portion of the first driving bump and may not overlap with the second portion of the first driving bump.

In an embodiment, the pads may include a first pad and a second pad. In such an embodiment, the first pad may overlap with the first portion of the first driving bump and may not overlap with the second portion of the first driving bump. In such an embodiment, the second pad may include a first pad part overlapping with a first portion of a second driving bump of the driving bumps, and a second pad part overlapping with a second portion of the second driving bump.

In an embodiment, the second pad part may be covered by the insulating layer, and an opening may be defined in at least an area of the second pad part.

In an embodiment, the driving elements may include a plurality of pixels which displays an image. In such an embodiment, the display device may further include a plurality of signal lines disposed on the substrate and connected between the pads and the pixels.

In an embodiment, the electronic component may include a data driving chip disposed on the non-display area.

In an embodiment, the electronic component may include a printed circuit board partially disposed on the non-display area.

In an embodiment, the driving elements may include a plurality of input sensing electrodes. In such an embodiment, the display device may further include a plurality of signal lines disposed on the substrate and connected between the pads to the input sensing electrodes.

In an embodiment, the electronic component may include an input sensing driving chip disposed on the non-display area.

In an embodiment, the electronic component may include a flexible printed circuit board partially disposed on the non-display area.

In another embodiment of the invention, a method for manufacturing a display device includes providing a display panel including a signal pad, aligning a bump, which has a greater planar area than the signal pad, of an electronic component with the signal pad of the display panel in such a way that an area of the bump not overlapping with the signal pad is in a range from about 10% to about 90% of a total area of the bump in a plan view, contacting the bump with the signal pad, and applying ultrasonic vibration to the bump and the signal pad.

In an embodiment, the applying the ultrasonic vibration may include applying the ultrasonic vibration to an interface between the bump and the signal pad.

In still another embodiment of the invention, an electronic panel includes a substrate including a pad area, a signal line a portion of which is disposed in the pad area, an insulating layer disposed on the substrate to expose the portion of the signal line which overlaps with the pad area, a signal pad disposed on the insulating layer and electrically connected to the portion of the signal line, and an electronic component comprising: a driving bump disposed on the signal pad and electrically connected to the signal pad. In such an embodiment, a first portion of the driving bump is in direct contact with the signal pad, and a second portion of the driving bump is in direct contact with a portion of the insulating layer not overlapping with the signal pad.

BRIEF DESCRIPTION OF THE DRAWINGS

The above and other features of the invention will become more apparent by describing in further detail exemplary embodiments thereof with reference to the accompanying drawings, in which:

FIGS. 9A to 9C are cross-sectional views illustrating a method for manufacturing a display device according to an embodiment of the invention;

DETAILED DESCRIPTION OF THE EMBODIMENTS

Figure 1:
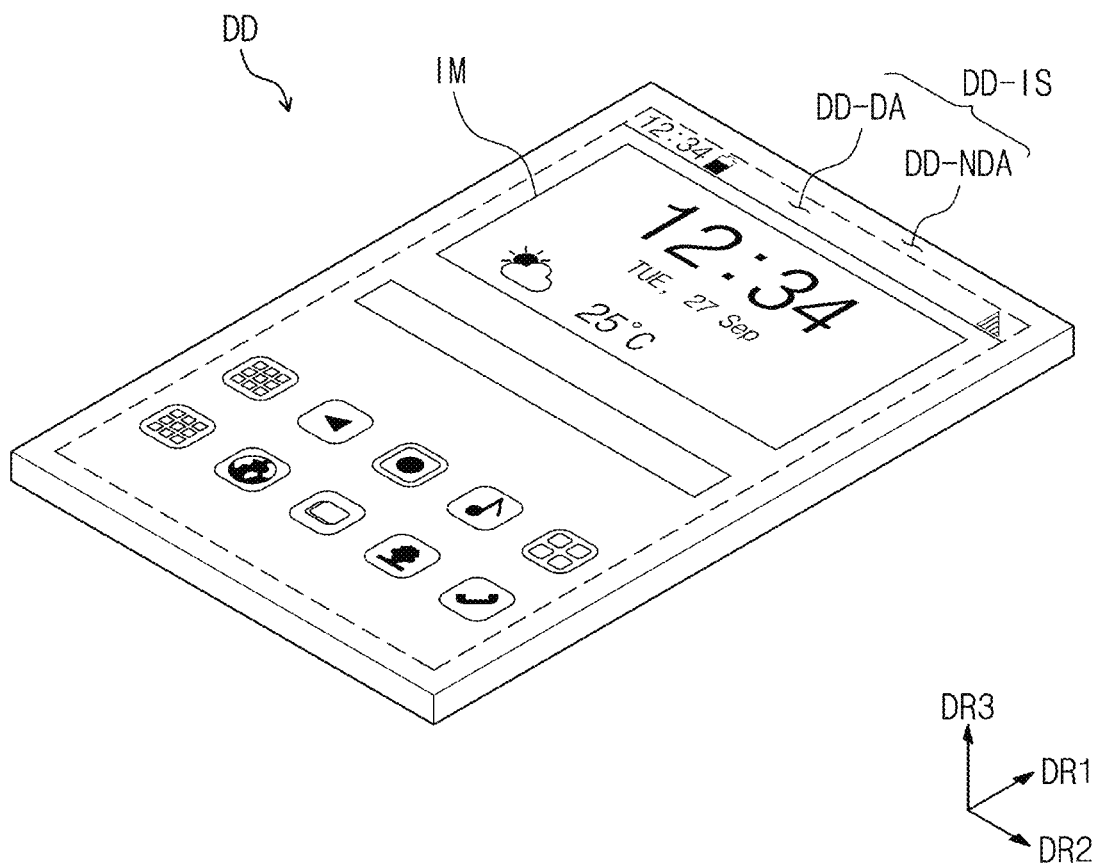
FIG. 1 is a perspective view illustrating a display device according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element such as a layer, region or substrate is referred to as being "on" another element, it can be directly on the other element or intervening elements may be present. In contrast, the term "directly" means that there are no intervening elements.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross-sectional illustrations and/or plane illustrations that are idealized exemplary illustrations. In the drawings, the thicknesses of layers and regions are exaggerated for clarity. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of exemplary embodiments.

Hereinafter, embodiments of the invention will be described in detail with reference to the accompanying drawings.

Figure 2:
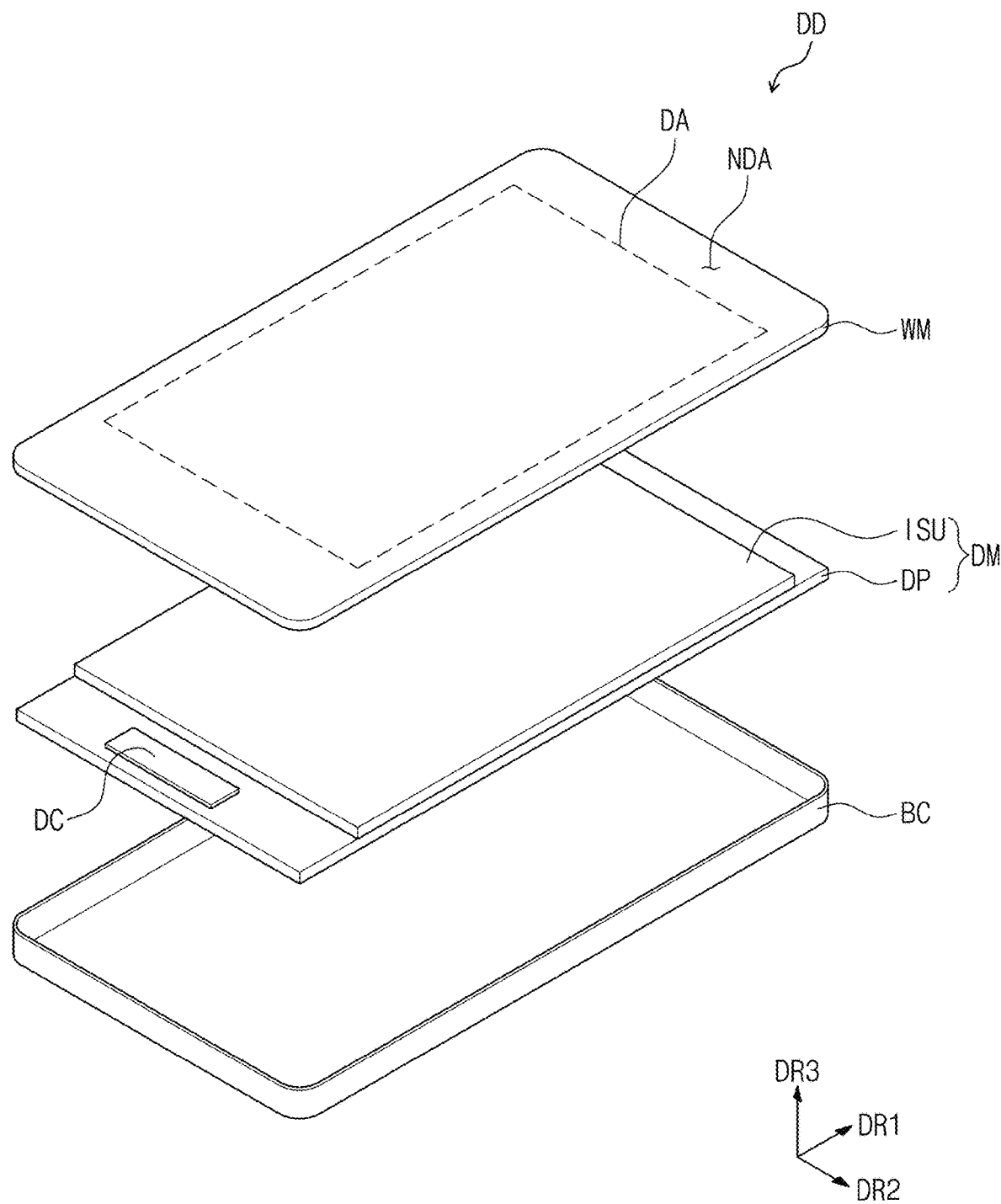
FIG. 2 is an exploded perspective view illustrating a display device according to an embodiment of the invention.
Figure 3:
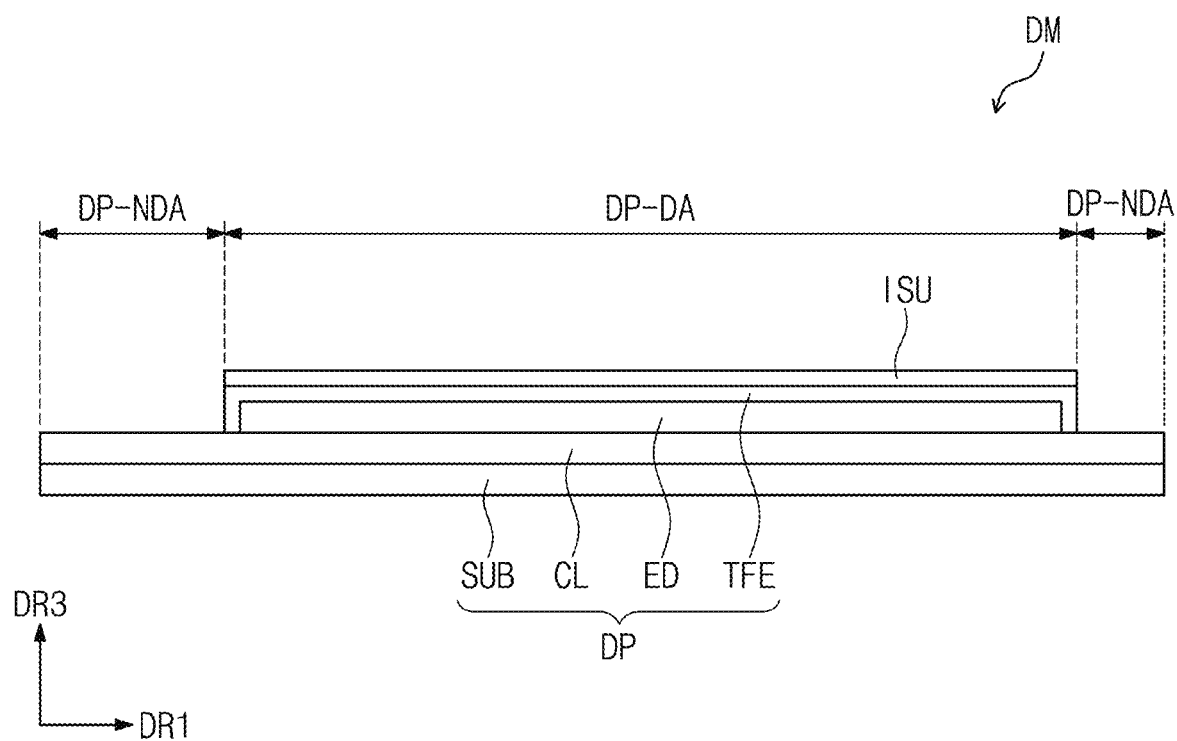
FIG. 3 is a cross-sectional view illustrating a display module according to an embodiment of the invention.

FIG. 1 is a perspective view illustrating a display device according to an embodiment of the invention. FIG. 2 is an exploded perspective view illustrating a display device according to an embodiment of the invention. FIG. 3 is a cross-sectional view illustrating a display module according to an embodiment of the invention.

As illustrated in FIG. 1, an embodiment of a display device DD may display an image IM through a display surface DD-IS thereof. The display surface DD-IS is parallel to a plane defined by a first direction DR1 and a second direction DR2. A normal direction of the display surface DD-IS (i.e., a thickness direction of the display device DD) is indicated by a third direction DR3.

A front surface (or a top surface) and a back surface (or a bottom surface) of each of members or units described herein are defined by the normal direction of the display surface DD-IS or the third direction DR3. However, the first to third directions DR1, DR2 and DR3 are not limited to those shown in FIG. 1. Herein, the first to third directions DR1, DR2 and DR3 may be relative concepts and may be changed into other directions.

An embodiment of the display device DD having the planar display surface DD-IS is illustrated in FIG. 1. However, embodiments of the invention are not limited thereto. In an alternative embodiment, the display device DD may include a curved display surface or a three-dimensional ("3D") display surface. The 3D display surface may include a plurality of display areas extending different directions from each other. In one embodiment, for example, the 3D display surface may include a polygonal pillar-shaped display surface.

In an embodiment, the display device DD may be a rigid display device. However, embodiments of the invention are not limited thereto. In an alternative embodiment, the display device DD may be a flexible display device. In FIG. 2, an embodiment of the display device DD which can be applied to a mobile phone is illustrated. Even though not shown in the drawings, electronic modules, a camera module and a power module, which are disposed, e.g., mounted, on a main board, may be disposed together with the display device DD in a bracket and/or a case to constitute the mobile phone. The display device DD according to the invention may be applied to large-sized electronic devices (e.g., televisions and monitors) and small and middle-sized electronic devices (e.g., tablets, car navigation units, game consoles, and smart watches).

In an embodiment, as illustrated in FIG. 1, the display surface DD-IS includes a display area DD-DA in which the image IM is displayed, and a non-display area DD-NDA adjacent to the display area DD-DA. An image is not displayed in the non-display area DD-NDA. In an embodiment, as shown in FIG. 1, the image IM may be icon images.

In an embodiment, as illustrated in FIG. 1, the display area DD-DA may have a quadrilateral shape (e.g., a rectangular shape). The non-display area DD-NDA may surround the display area DD-DA. However, embodiments of the invention are not limited thereto. The shapes of the display area DD-DA and the non-display area DD-NDA may be variously modified.

Referring to FIG. 2, an embodiment of the display device DD may include a window member WM, a display module DM, a driving chip DC, and a receiving member BC.

The window member WM may be disposed on the display module DM and may transmit an image, provided from the display module DM, through a display area DA thereof. In one embodiment, for example, the window member WM may include or be formed of glass, sapphire, or plastic, for example. The window member WM may include the display area DA and a non-display area NDA. The display area DA and the non-display area NDA of the window member WM may overlap with the display area DD-DA and the non-display area DD-NDA of the display device DD described above, respectively. Herein, when an element overlap with another element, the element overlap with the another element when viewed from a plan view in the thickness direction of the display device or the third direction DR3.

In an embodiment, as shown in FIG. 2, the window member WM has a single-layer structure. However, embodiments of the invention are not limited thereto. In an alternative embodiment, the window member WM may have a multi-layer structure. In one embodiment, for example, the window member WM may include a base layer, and at least one bezel layer disposed on a bottom surface of the base layer to correspond to the non-display area NDA.

The display module DM is disposed between the window member WM and the receiving member BC. The display module DM includes a display panel DP and an input sensing unit ISU. The input sensing unit ISU may be disposed between the window member WM and the display panel DP.

According to embodiments of the invention, the display panel DP may be an organic light emitting diode display panel, a liquid crystal display panel, a plasma display panel, an electrophoretic display panel, a microelectromechanical system ("MEMS") display panel, or an electrowetting display panel.

For convenience of description, embodiments in which the display panel DP is the organic light emitting diode display panel, will hereinafter be described in detail. However, embodiments of the invention are not limited thereto. In alternative embodiments, the display panel DP may be other types of display panel.

In such an embodiment, the display panel DP may output an image and may provide the image to the window member WM. The display panel DP may overlap with the display area DD-DA.

The input sensing unit ISU obtains information on coordinates of an external input. The input sensing unit ISU may be disposed directly on the display panel DP. In the embodiment, the input sensing unit ISU may be integrally formed with the display panel DP by continuous processes. However, embodiments of the invention are not limited thereto. In an alternative embodiment, the input sensing unit ISU may be formed independently from the display panel DP, and then may be coupled to the display panel DP by an adhesive member.

In an embodiment, although not shown in the drawings, the display module DM may further include an anti-reflection layer. The anti-reflection layer may include a color filter, a stack structure of a conductive layer/a dielectric layer/a conductive layer, or an optical member. The anti-reflection layer may absorb, destructively interfere with or polarize an external light incident from an outside to reduce a reflectance of the external light.

Referring to FIG. 3, the display panel DP of the display module DM may include a substrate SUB, a circuit layer CL, a display element layer ED, and a thin film encapsulation layer TFE. The circuit layer CL, the display element layer ED and the thin film encapsulation layer TFE may be disposed on the substrate SUB. The substrate SUB may include a plastic film. The substrate SUB may be a flexible substrate and may include a plastic substrate, a glass substrate, a metal substrate, or an organic/inorganic composite substrate, for example.

The circuit layer CL may include a plurality of insulating layers, a plurality of conductive layers, and a semiconductor layer. The plurality of conductive layers of the circuit layer CL may include signal lines and/or a control circuit of a pixel. The display element layer ED may include an organic light emitting diode.

The display element layer ED may include a plurality of organic light emitting diodes corresponding to light emitting elements. The display element layer ED may further include an organic layer such as a pixel defining layer.

The thin film encapsulation layer TFE encapsulates the display element layer ED. The thin film encapsulation layer TFE includes an insulating layer. In an embodiment, the thin film encapsulation layer TFE may include an inorganic layer (hereinafter, referred to as an encapsulation inorganic layer). In an embodiment, the thin film encapsulation layer TFE may include an organic layer (hereinafter, referred to as an encapsulation organic layer) and an encapsulation inorganic layer.

The encapsulation inorganic layer protects the display element layer ED from water/oxygen, and the encapsulation organic layer protects the display element layer ED from a foreign material such as dust particles. The encapsulation inorganic layer may include at least one of, but not limited to, a silicon nitride layer, a silicon oxynitride layer, a silicon oxide layer, a titanium oxide layer and an aluminum oxide layer. The encapsulation organic layer may include, but not limited to, an acrylic-based organic layer.

However, embodiments of the invention are not limited thereto. In an alternative embodiment, the display module DM may include an encapsulation substrate disposed to encapsulate the display element layer ED, instead of the thin film encapsulation layer TFE. The encapsulation substrate may include or be formed of glass, sapphire, or plastic.

According to an embodiment of the invention, the input sensing unit ISU is disposed directly on the thin film encapsulation layer TFE. The input sensing unit ISU includes input sensing electrodes and signal lines. The input sensing electrodes and the signal lines may have a single-layered or multi-layered structure. According to an alternative embodiment of the invention, the input sensing unit ISU may be coupled to the thin film encapsulation layer TFE by an adhesive member disposed on the thin film encapsulation layer TFE. This will be described later in greater detail with reference to FIG. 15.

The input sensing electrodes and the signal lines may include indium tin oxide ("ITO"), indium zinc oxide ("IZO"), zinc oxide (ZnO), indium tin zinc oxide ("ITZO"), poly(3,4-ethylenedioxythiophene) ("PEDOT"), metal nanowire, or graphene. In some embodiments, the input sensing electrodes and the signal lines may include a metal layer including molybdenum, silver, titanium, copper, aluminum, or any alloy thereof, for example. The input sensing electrodes and the signal lines may have a same layer structure as each other or different layer structures from each other. The input sensing unit ISU will be described later in greater detail.

Figure 4:
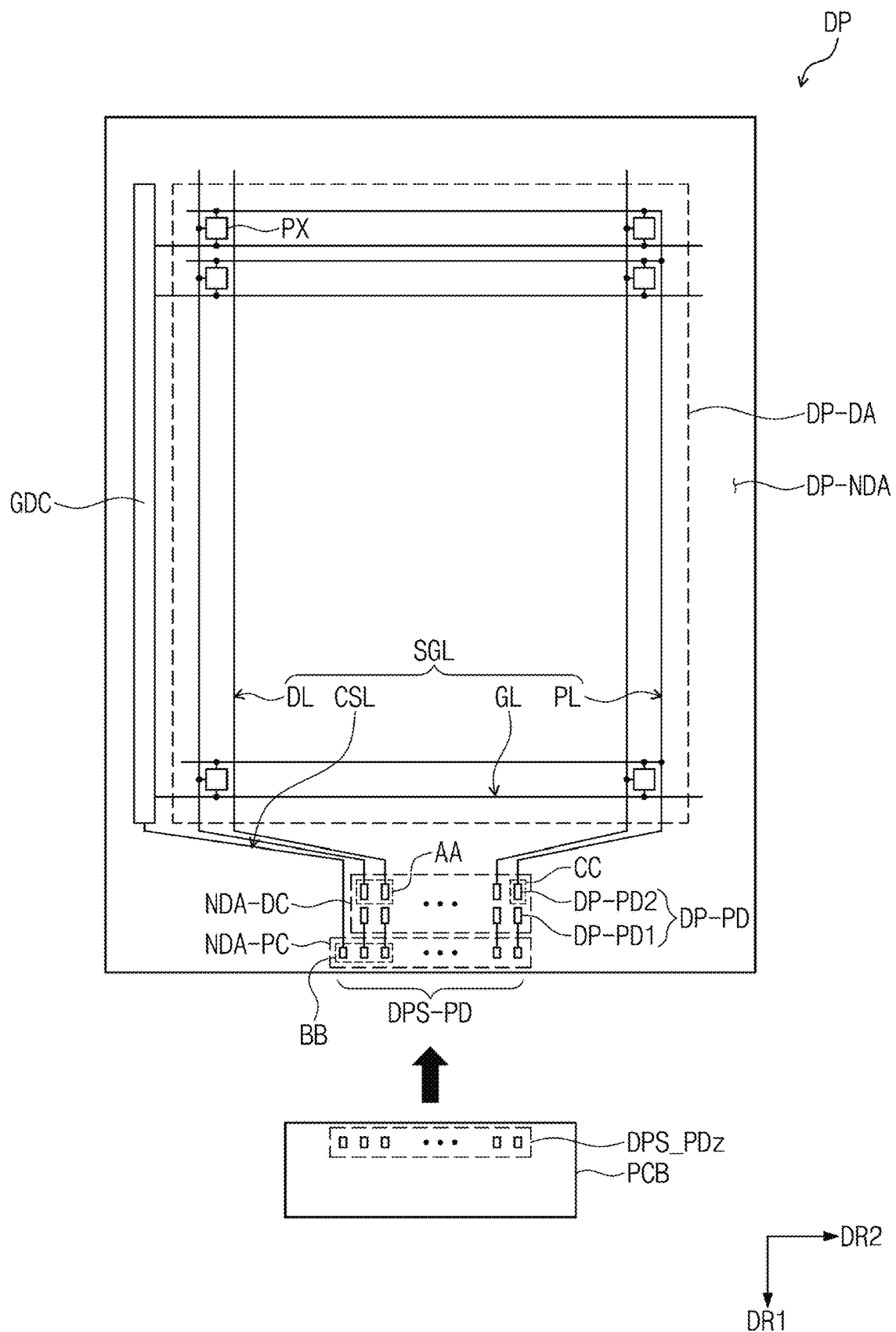
FIG. 4 is a plan view illustrating a display panel according to an embodiment of the invention.
Figure 5:
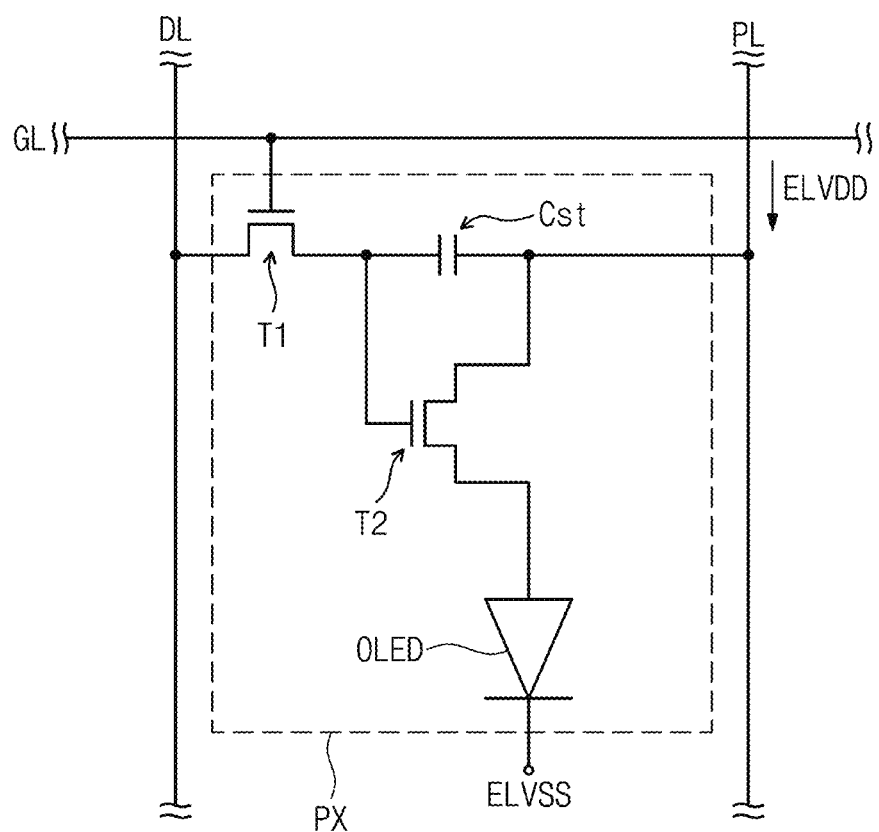
FIG. 5 is an equivalent circuit diagram of a pixel illustrated in FIG. 4.

FIG. 4 is a plan view illustrating a display panel according to an embodiment of the invention. FIG. 5 is an equivalent circuit diagram of a pixel illustrated in FIG. 4.

In an exemplary embodiment, the display panel DP includes a display area DP-DA and a non-display area DP-NDA when viewed in a plan view. In an embodiment, as shown in FIG. 4, the non-display area DP-NDA may be defined adjacent to the display area DP-DA. In one embodiment, for example, the non-display area DP-NDA may be defined along a border of the display area DP-DA. The display area DP-DA and the non-display area DP-NDA of the display panel DP correspond to the display area DD-DA and the non-display area DD-NDA of the display device DD illustrated in FIG. 1, respectively.

The display panel DP may include a driving circuit GDC, a plurality of signal lines SGL, a plurality of driving signal pads DP-PD, a plurality of connection signal pads DPS-PD, and a plurality of pixels PX. The pixels PX are disposed in the display area DP-DA. Each of the pixels PX includes an organic light emitting diode and a pixel driving circuit connected to the organic light emitting diode. The driving circuit GDC, the signal lines SGL, the driving signal pads DP-PD, the connection signal pads DPS-PD and the pixel driving circuit may be included in the circuit layer CL illustrated in FIG. 3.

The driving circuit GDC may include a scan driving circuit. The scan driving circuit generates a plurality of scan signals and sequentially outputs the scan signals to a plurality of scan lines GL to be described below. The scan driving circuit may further output other control signals to the pixel driving circuits of the pixels PX.

The scan driving circuit may include a plurality of thin film transistors formed by a same process (e.g., a low-temperature polycrystalline silicon ("LTPS") process or a low-temperature polycrystalline oxide ("LTPO") process) as the pixel driving circuits of the pixels PX.

The signal lines SGL include scan lines GL, data lines DL, a power line PL, and a control signal line CSL. Each of the scan lines GL is connected to corresponding one of the pixels PX, and each of the data lines DL is connected to corresponding one of the pixels PX. The power line PL is connected to the pixels PX. The control signal line CSL may provide control signals to the scan driving circuit.

The signal lines SGL overlap with the display area DP-DA and the non-display area DP-NDA. Each of the signal lines SGL may include a pad portion and a line portion. The line portion overlaps with the display area DP-DA and the non-display area DP-NDA. The pad portion is connected to an end of the line portion. The pad portion is disposed in the non-display area DP-NDA and overlaps with a corresponding one of the driving signal pads DP-PD. This will be described later in greater detail. An area, in which the driving signal pads DP-PD are disposed, of the non-display area DP-NDA may be defined as a driving pad area NDA-DC.

According to an embodiment, the driving chip DC illustrated in FIG. 2 may be mounted on the driving pad area NDA-DC. In such an embodiment, the driving signal pads DP-PD may be electrically connected to the driving chip DC to transmit electrical signals received from the driving chip DC to the signal lines SGL.

In such an embodiment, connection signal lines DSL (see FIG. 8A), which connect the driving signal pads DP-PD to the connection signal pads DPS-PD, respectively, may be disposed in the non-display area DP-NDA. One or some of the connection signal lines may be connected to the driving circuit GDC, and the others of the connection signal lines may be connected to the connection signal pads DPS-PD.

Each of the connection signal lines may include a connection pad portion and a connection line portion. The connection pad portions are connected to ends of the connection line portions, respectively. The connection pad portion overlaps with a corresponding one of the connection signal pads DPS-PD. This will be described later in greater detail. An area, in which the connection signal pads DPS-PD are disposed, may be defined as a connection pad area NDA-PC.

According to an embodiment of the invention, an area of a printed circuit board PCB may be disposed on the connection pad area NDA-PC. In such an embodiment, the connection signal pads DPS-PD may be electrically connected to the printed circuit board PCB to transmit electrical signals received from the printed circuit board PCB to the driving signal pads DP-PD. The printed circuit board PCB may be rigid or flexible. In one embodiment, for example, where the printed circuit board PCB is desired to be flexible, the printed circuit board PCB may be a flexible printed circuit board.

Substantially, the line portions connected to the pixels PX constitute most of the signal lines SGL. The line portion is connected to transistors T1 and T2 (see FIG. 5) of the pixel PX. The line portion may have a single-layered or multi-layered structure. The line portion may be a single unitary body or may include two or more portions. The two or more portions may be disposed on different layers from each other and may be connected to each other through a contact hole defined through an insulating layer disposed between the two or more portions.

In an embodiment, as shown in FIG. 4, the printed circuit board PCB is electrically connected to the display panel DP. The printed circuit board PCB may be a rigid printed circuit board or a flexible printed circuit board. The printed circuit board PCB may be coupled directly to the display panel DP or may be connected to the display panel DP through another printed circuit board. Hereinafter, for convenience of description, embodiments where the printed circuit board PCB coupled directly to the connection pad area NDA-PC of the display panel DP will be described in detail.

In an embodiment, a timing control circuit for controlling operations of the display panel DP may be disposed on the printed circuit board PCB. The timing control circuit may be mounted on the printed circuit board PCB in the form of an integrated chip. In an embodiment, although not shown in the drawings, an input sensing circuit for controlling the input sensing unit ISU (see FIG. 3) may be disposed on the printed circuit board PCB. The input sensing circuit may be mounted on the printed circuit board PCB in the form of an integrated chip.

In an embodiment, the timing control circuit and the input sensing circuit are mounted on the printed circuit board PCB. However, embodiments of the invention are not limited thereto. In an alternative embodiment, the timing control circuit and the input sensing circuit may be mounted directly on the non-display area DP-NDA of the display panel DP. In another alternative embodiment, the timing control circuit and the input sensing circuit may be manufactured in the form of a single integrated chip, and the single integrated chip may be mounted on the printed circuit board PCB or the non-display area DP-NDA of the display panel DP.

The printed circuit board PCB may include printed circuit board pads DPS-PDz electrically connected to the display panel DP. The printed circuit board pads DPS-PDz overlap with the connection signal pads DPS-PD and are electrically connected to the connection signal pads DPS-PD.

FIG. 5 illustrates a scan line GL, a data line DL, the power line PL, and a pixel PX connected thereto. However, the configuration of the pixel PX is not limited to FIG. 5, but may be variously modified.

An organic light emitting diode OLED of the pixel PX may be a front surface type light emitting diode or a back surface type light emitting diode. The pixel PX includes a first transistor (or a switching transistor) T1, a second transistor (or a driving transistor) T2 and a capacitor Cst, which collectively constitute the pixel driving circuit for driving the organic light emitting diode OLED. A first power source voltage ELVDD is provided to the second transistor T2, and a second power source voltage ELVSS is provided to the organic light emitting diode OLED. The second power source voltage ELVSS may be lower than the first power source voltage ELVDD.

The first transistor T1 outputs a data signal, which is applied thereto through the data line DL, in response to a scan signal applied thereto through the scan line GL. The capacitor Cst is charged with a voltage corresponding to the data signal received from the first transistor T1. The second transistor T2 is connected to the organic light emitting diode OLED. The second transistor T2 controls a driving current flowing through the organic light emitting diode OLED in response to the amount of charges stored in the capacitor Cst.

The equivalent circuit of FIG. 5 merely shows an exemplary embodiment of the pixel PX, and embodiments of the invention are not limited thereto. In an alternative embodiment, the pixel PX may further include a plurality of transistors and/or may include two or more capacitors. In another alternative embodiment, the organic light emitting diode OLED may be connected between the power line PL and the second transistor T2.

Figure 6:
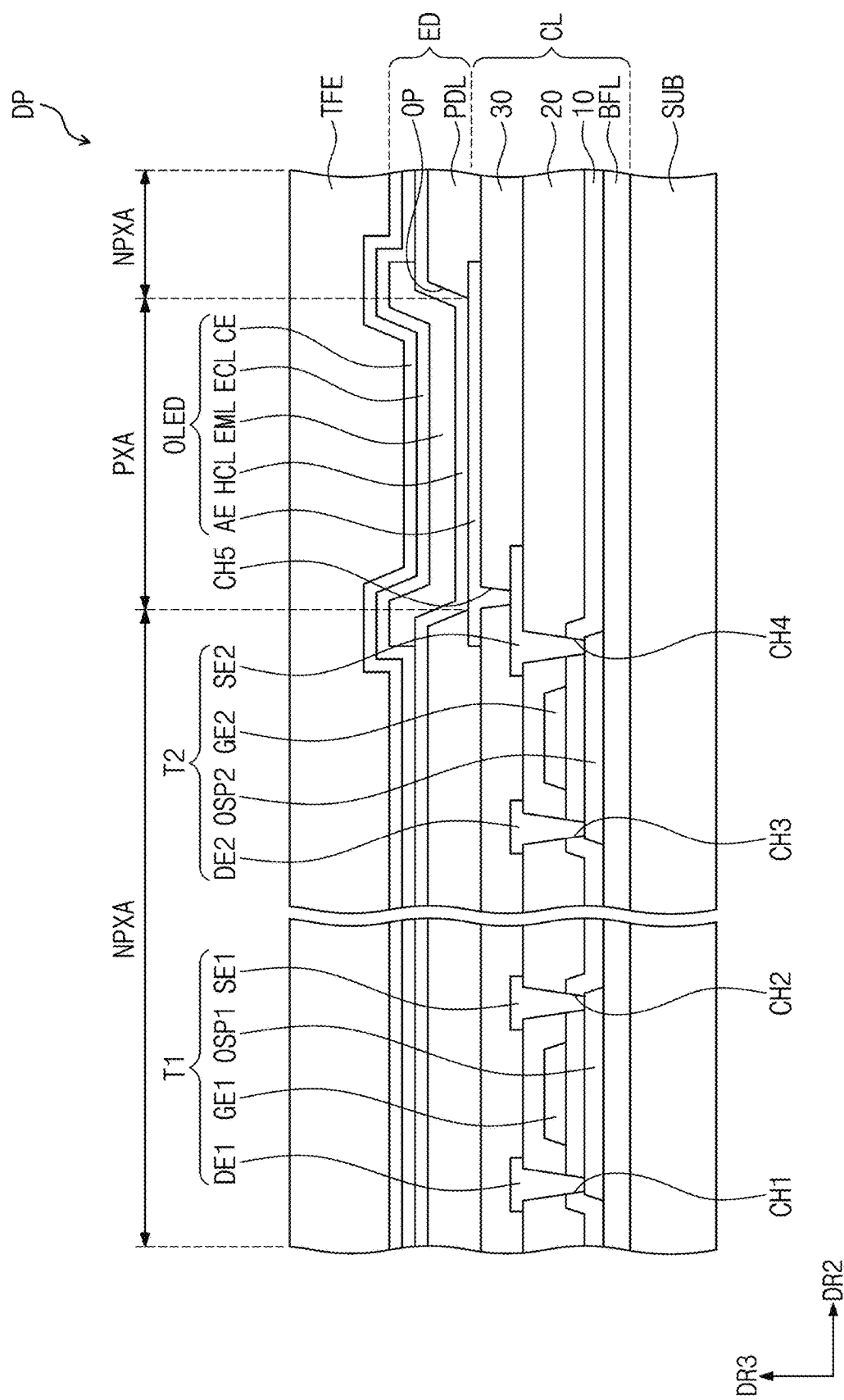
FIG. 6 is an enlarged cross-sectional view illustrating a display panel according to an embodiment of the invention.

FIG. 6 is an enlarged cross-sectional view illustrating a display panel according to an embodiment of the invention.

Referring to FIG. 6, in an embodiment of a display panel, the circuit layer CL, the display element layer ED and the thin film encapsulation layer TFE are sequentially stacked on the substrate SUB. In such an embodiment, the circuit layer CL may include a buffer layer BFL, which is an inorganic layer, a first insulating layer 10, a second insulating layer 20, and a third insulating layer 30. Each of the first to third insulating layers 10, 20 and 30 may include an inorganic layer or an organic layer. In one embodiment, for example, each of the first to third insulating layers 10, 20 and 30 may include the inorganic layer and the organic layer. Materials of the inorganic layer and the organic layer are not limited to specific materials, and the buffer layer BFL may be selectively omitted in some embodiments of the invention.

A semiconductor pattern OSP1 (hereinafter, referred to as 'a first semiconductor pattern') of the first transistor T1 and a semiconductor pattern OSP2 (hereinafter, referred to as 'a second semiconductor pattern') of the second transistor T2 are disposed on the buffer layer BFL. Each of the first and second semiconductor patterns OSP1 and OSP2 may include amorphous silicon, poly-silicon, or a metal oxide semiconductor.

The first insulating layer 10 is disposed on the first semiconductor pattern OSP1 and the second semiconductor pattern OSP2. A control electrode GE1 (hereinafter, referred to as 'a first control electrode') of the first transistor T1 and a control electrode GE2 (hereinafter, referred to as 'a second control electrode') of the second transistor T2 are disposed on the first insulating layer 10. The first control electrode GE1 and the second control electrode GE2 may be formed through a same photolithography process as the scan lines GL (see FIGS. 4 and 5).

The second insulating layer 20 is disposed on the first insulating layer 10 and covers the first control electrode GE1 and the second control electrode GE2. An input electrode DE1 (hereinafter, a first input electrode) and an output electrode SE1 (hereinafter, a first output electrode) of the first transistor T1 and an input electrode DE2 (hereinafter, a second input electrode) and an output electrode SE2 (hereinafter, a second output electrode) of the second transistor T2 are disposed on the second insulating layer 20.

The first input electrode DE1 and the first output electrode SE1 are connected to portions of the first semiconductor pattern OSP1 through a first through-hole CH1 and a second through-hole CH2, each of which is defined through the first and second insulating layers 10 and 20. The second input electrode DE2 and the second output electrode SE2 are connected to portions of the second semiconductor pattern OSP2 through a third through-hole CH3 and a fourth through-hole CH4, each of which is defined through the first and second insulating layers 10 and 20. In an alternative embodiment, at least one of the first transistor T1 or the second transistor T2 may have a bottom gate structure.

The third insulating layer 30 is disposed on the second insulating layer 20, and covers the first input electrode DE1, the second input electrode DE2, the first output electrode SE1 and the second output electrode SE2. The third insulating layer 30 may have a flat upper surface to provide a flat surface thereon.

The display element layer ED is disposed on the third insulating layer 30. The display element layer ED may include a pixel defining layer PDL and the organic light emitting diode OLED. The pixel defining layer PDL may include an organic material. A first electrode AE is disposed on the third insulating layer 30. The first electrode AE is connected to the second output electrode SE2 through a fifth through-hole CH5 defined through the third insulating layer 30. An opening OP is defined in the pixel defining layer PDL. The opening OP of the pixel defining layer PDL exposes at least a portion of the first electrode AE. In an alternative embodiment of the invention, the pixel defining layer PDL may be omitted.

The pixel PX may be disposed in the display area DP-DA. The display area DP-DA may include a light emitting area PXA and a non-light emitting area NPXA adjacent to the light emitting area PXA. The non-light emitting area NPXA may surround the light emitting area PXA. In an embodiment, the light emitting area PXA is defined to correspond to a partial area of the first electrode AE, which is exposed through the opening OP.

According to an embodiment, the light emitting area PXA may overlap with at least one of the first transistor T1 or the second transistor T2. In such an embodiment, the opening OP may further extend to overlap with at least one of the first transistor T1 or the second transistor T2, and the first electrode AE and a light emitting layer EML to be described later may thereby further extend.

A hole control layer HCL may be disposed in common in the light emitting area PXA and the non-light emitting area NPXA. Although not shown in the drawings, a common layer such as the hole control layer HCL may be disposed in common in the pixels PX (see FIG. 4). Herein, when a layer is disposed in common in a plurality of regions or areas, a single and unitary layer is disposed to overlap all of the regions or areas.

A light emitting layer EML is disposed on the hole control layer HCL. The light emitting layer EML may be disposed in an area corresponding to the opening OP. In such an embodiment, the light emitting layers EML of the pixels PX may be separated or spaced apart from each other. The light emitting layer EML may include an organic material and/or an inorganic material. The light emitting layer EML may generate light having a predetermined color.

In an embodiment, the light emitting layer EML may be patterned. However, in an alternative embodiment, the light emitting layer EML may be disposed in common in the pixels PX. In such an embodiment, the light emitting layer EML may generate white light. In such an embodiment, the light emitting layer EML may have a multi-layered structure which is called 'a tandem'.

An electron control layer ECL is disposed on the light emitting layer EML. Although not shown in the drawings, the electron control layer ECL may be disposed in common in the pixels PX (see FIG. 4). A second electrode CE is disposed on the electron control layer ECL. The second electrode CE is disposed in common in the pixels PX.

The thin film encapsulation layer TFE is disposed on the second electrode CE. The thin film encapsulation layer TFE is disposed in common in the pixels PX. In an embodiment, the thin film encapsulation layer TFE directly covers the second electrode CE. In an embodiment of the invention, a capping layer covering the second electrode CE may further be disposed between the thin film encapsulation layer TFE and the second electrode CE. In such an embodiment, the thin film encapsulation layer TFE may directly cover the capping layer.

Figure 7A:
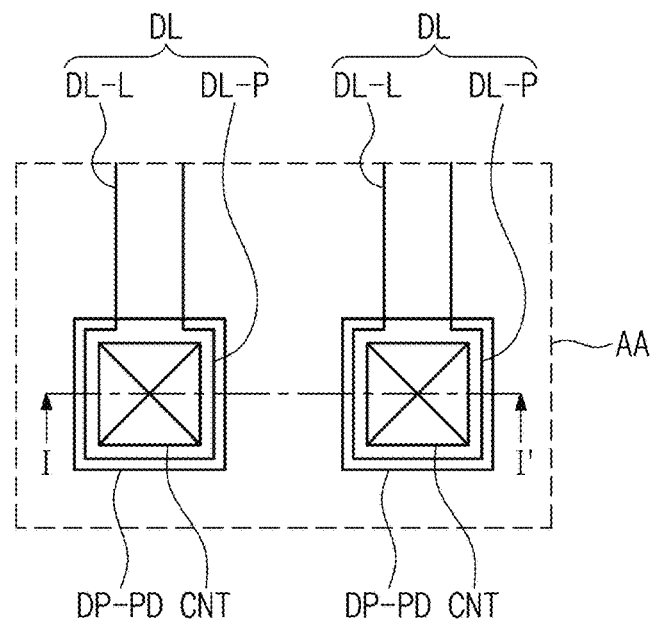
FIG. 7A is an enlarged view of an area AA of FIG. 4.
Figure 7B:
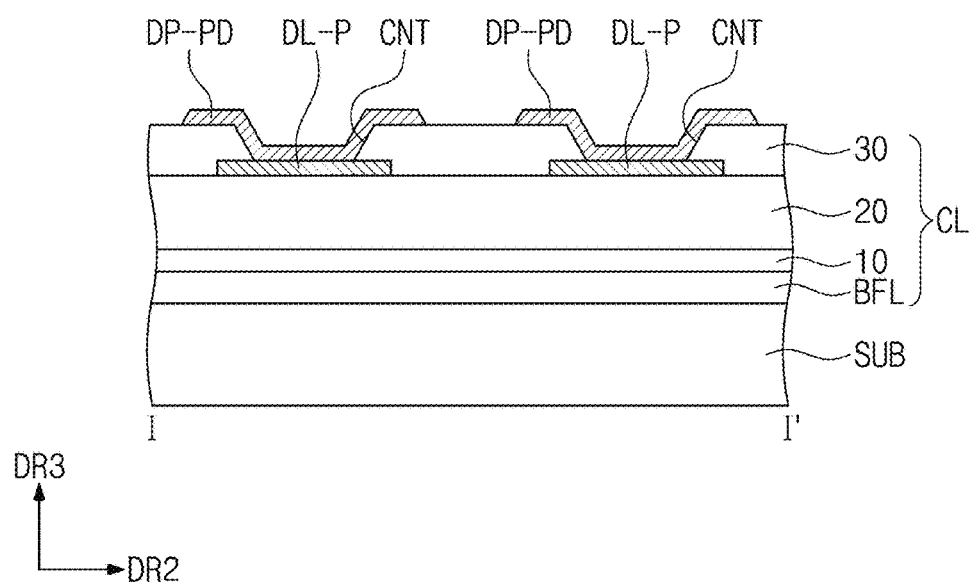
FIG. 7B is a cross-sectional view taken along line I-I' of FIG. 7A.
Figure 7C:
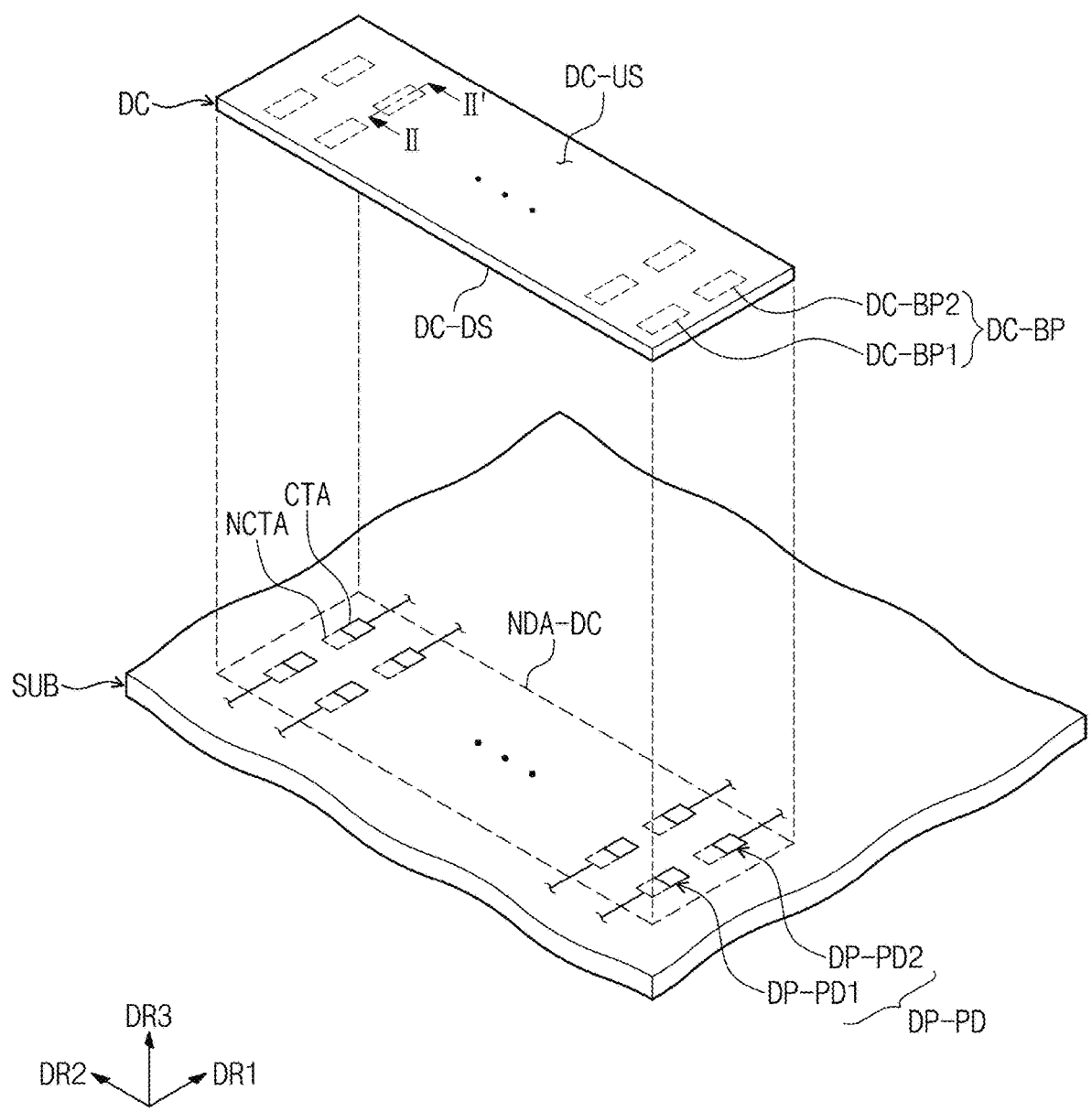
FIG. 7C is an exploded perspective view illustrating a driving chip and a display substrate according to an embodiment of the invention.
Figure 7D:
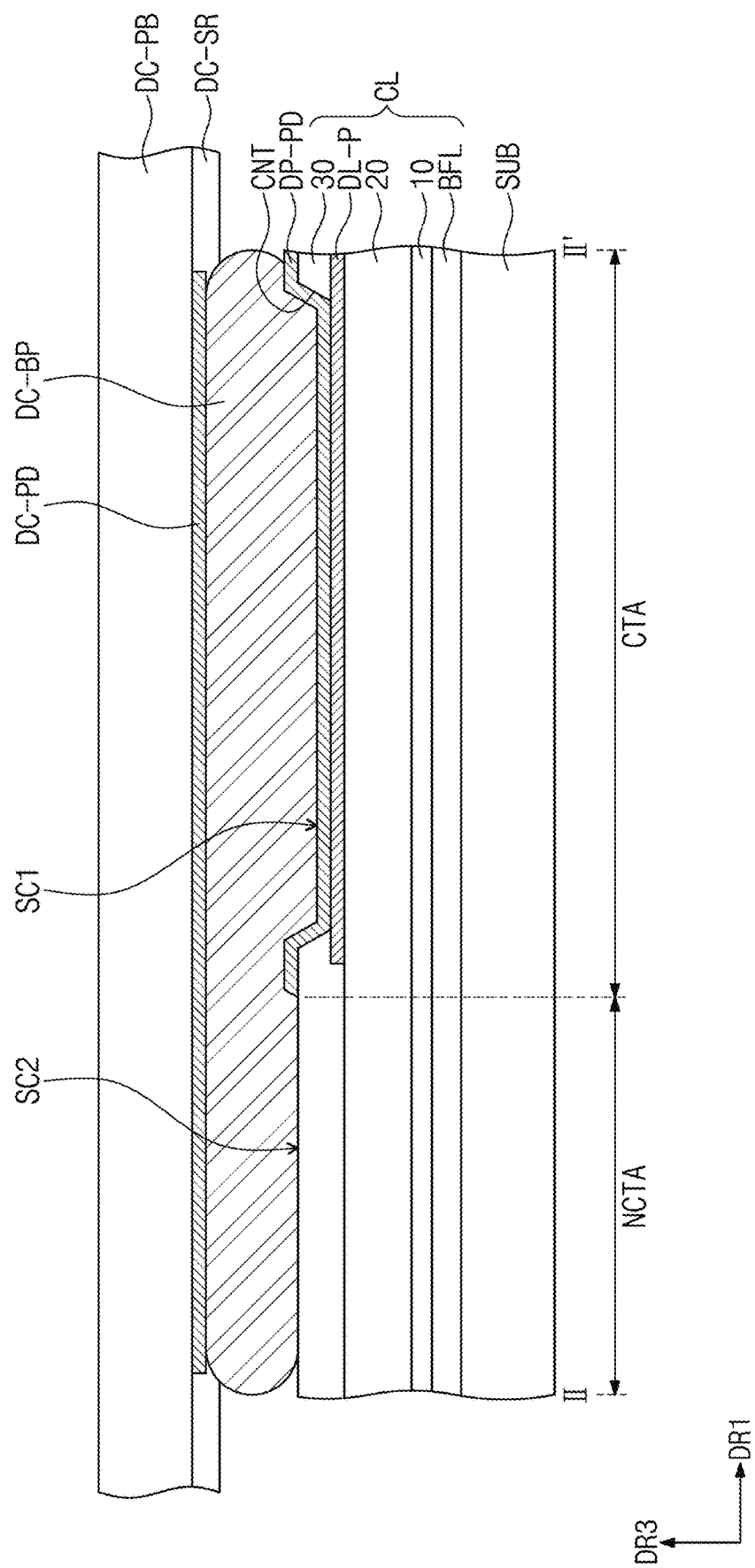
FIG. 7D is a cross-sectional view taken along line II-II' of FIG. 7C.
Figure 7E:
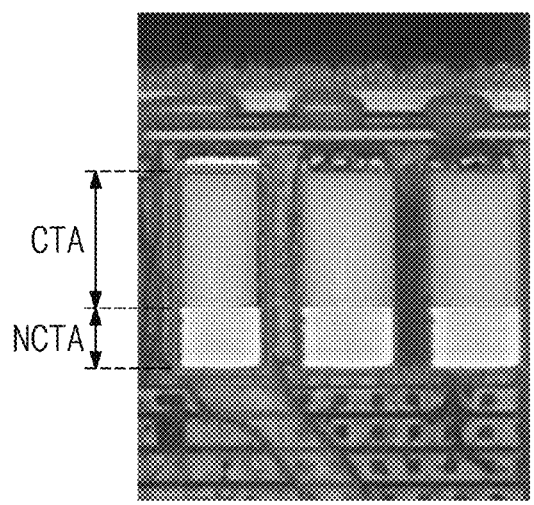
FIG. 7E is an image showing a contact between a signal pad and a driving bump according to an embodiment of the invention.

FIG. 7A is an enlarged view of an area AA of FIG. 4. FIG. 7B is a cross-sectional view taken along line I-I' of FIG. 7A. FIG. 7C is an exploded perspective view illustrating a driving chip and a display substrate according to an embodiment of the invention. FIG. 7D is a cross-sectional view taken along line II-II' of FIG. 7C. FIG. 7E is an image showing a contact between a signal pad and a driving bump according to an embodiment of the invention.

FIG. 7A illustrates line portions DL-L and pad portions DL-P of two of the data lines DL. In an embodiment, the signal line SGL of FIG. 4 includes the line portion DL-L and the pad portion DL-P. However, in an alternative embodiment, the line portion DL-L and the pad portion DL-P may be provided or formed independently of each other. In such an embodiment, the display panel DP may include signal lines SGL corresponding to the line portions, and pads connected to the signal lines SGL, respectively. Here, the pads may correspond to the pad portions DL-P, respectively. In such an embodiment, the signal line SGL of FIG. 4 and the pad portion (or the pad) DL-P connected thereto may constitute a single body or may be provided as individual components connected to each other.

In an embodiment, an area of the pad portion DL-P per unit length may be greater than an area of the line portion DL-L per unit length. In such an embodiment, a width of the pad portion DL-P may be greater than a width of the line portion DL-L. In an embodiment, the pad portions DL-P have quadrilateral shapes as shown in FIG. 7A. However, the shapes of the pad portions DL-P may be variously modified or changed in manufacturing processes.

In an embodiment, as illustrated in FIG. 7B, the pad portions DL-P of the data lines DL may be disposed on the second insulating layer 20. The third insulating layer 30 may cover the pad portions DL-P of the data lines DL. The driving signal pads DP-PD are disposed on the third insulating layer 30. Each of the driving signal pads DP-PD is connected to a corresponding one of the pad portions DL-P. Each of the driving signal pads DP-PD may be electrically connected to the corresponding pad portion DL-P through a contact hole CNT defined through the third insulating layer 30. In such an embodiment, the third insulating layer 30 may expose each of the pad portions DL-P through the contact hole CNT, and the driving signal pad DP-PD and the pad portion DL-P may be in electrical contact with each other through the portion of the pad portion DL-P exposed by the contact hole CNT of the third insulating layer 30.

Referring to FIG. 7C, the driving chip DC may include a top surface DC-US and a bottom surface DC-DS, and may include a plurality of driving bumps DC-BP disposed on the bottom surface DC-DS. In an alternative embodiment, the driving bumps DC-BP may not be components included in the driving chip DC, and the driving bumps DC-BP may be provided as additional components for mounting the driving chip DC on the driving pad area NDA-DC.

The driving signal pads DP-PD disposed on the substrate SUB may include a plurality of first driving signal pads DP-PD1 and a plurality of second driving signal pads DP-PD2. The driving bumps DC-BP disposed on the bottom surface DC-DS of the driving chip DC may include a plurality of first driving bumps DC-BP1 and a plurality of second driving bumps DC-BP2.

The first driving signal pads DP-PD1 electrically connect the connection signal pads DPS-PD (see FIG. 4) to the first driving bumps DC-BP1. The second driving signal pads DP-PD2 electrically connect the second driving bumps DC-BP2 to the signal lines SGL (see FIG. 4).

In an embodiment, the driving chip DC may include a circuit element (not shown) that generates signals to be provided to the pixels based on electrical signals received from the first driving bumps DC-BP1. The second driving bumps DC-BP2 may transmit the signals outputted from the circuit element of the driving chip DC to the second driving signal pads DP-PD2.

Referring to FIG. 7D, the driving chip DC includes a circuit substrate DC-PB, a circuit pad DC-PD disposed on the circuit substrate DC-PB, and solder paste DC-SR disposed on the circuit substrate DC-PB to expose the circuit pad DC-PD. Even though not shown in the drawings, the circuit pad DC-PD may include a plurality of circuit pads respectively corresponding to the driving bumps DC-BP. One of the driving bumps DC-BP is disposed on a corresponding one of the circuit pads and is electrically connected to the one circuit pad DC-PD.

Hereinafter, one driving signal pad DP-PD, one pad portion DL-P and one driving bump DC-BP, which are connected to each other, will be described in greater detail with reference to FIG. 7D.

According to an embodiment of the invention, as shown in FIG. 7D, a contact area CTA and a non-contact area NCTA may be defined in a display substrate. The driving bump DC-BP is in direct contact with the driving signal pad DP-PD in the contact area CTA, and the driving bump DC-BP is not in contact with the driving signal pad DP-PD in the non-contact area NCTA.

The pad portion DL-P may overlap with the contact area CTA and may be disposed on the second insulating layer 20. The third insulating layer 30 may cover the pad portion DL-P and may be disposed on the second insulating layer 20. In such an embodiment, as described above, the third insulating layer 30 exposes the pad portion DL-P through the contact hole CNT described with reference to FIG. 7B.

The driving signal pad DP-PD may not overlap with the non-contact area NCTA. The driving signal pad DP-PD may be disposed on the third insulating layer 30 in such a way that at least a portion of the driving signal pad DP-PD is disposed on the pad portion DL-P. Alternatively, the driving signal pad DP-PD may be disposed only on the pad portion DL-P.

According to an embodiment of the invention, the driving bump DC-BP may include a first portion overlapping with the contact area CTA and a second portion overlapping with the non-contact area NCTA. In such an embodiment, the first portion of the driving bump DC-BP is in direct contact with the driving signal pad DP-PD, and the second portion of the driving bump DC-BP does not overlap with the driving signal pad DP-PD but is in direct contact with the third insulating layer 30.

According to an embodiment, as described above, the pad portion DL-P and the driving signal pad DP-PD overlap with the contact area CTA but do not overlap with the non-contact area NCTA. Thus, electrical connection between the driving bump DC-BP and the driving signal pad DP-PD is formed in the contact area CTA but is not formed in the non-contact area NCTA.

In an embodiment of the invention, the first portion and the second portion of the driving bump DC-BP may be connected to the driving signal pad DP-PD and the third insulating layer 30, respectively, by an ultrasonic thermo-compression method. Hereinafter, an interface between the first portion of the driving bump DC-BP and the driving signal pad DP-PD is defined as a first interface SC1, and an interface between the second portion of the driving bump DC-BP and the third insulating layer 30 is defined as a second interface SC2.

In such an embodiment, when ultrasonic vibration is applied to the first interface SC1, frictional heat may be generated between the first portion of the driving bump DC-BP and the driving signal pad DP-PD. As a result, the first portion of the driving bump DC-BP and the driving signal pad DP-PD may be bonded (e.g., welded) to each other by the frictional heat.

In such an embodiment, when ultrasonic vibration is applied to the second interface SC2, frictional heat may be generated between the second portion of the driving bump DC-BP and the third insulating layer 30 overlapping with the non-contact area NCTA. As a result, the second portion of the driving bump DC-BP and the third insulating layer 30 overlapping with the non-contact area NCTA may be bonded (e.g., welded) to each other by the frictional heat.

According to an embodiment of the invention, a bonding state (or a bonding strength) between the driving bump DC-BP and the driving signal pad DP-PD may be checked based on a color at the second interface SC2 to which the ultrasonic vibration is applied. In such an embodiment, the color at the second interface SC2 may be checked through a back surface of the substrate SUB, i.e., a back surface of the display panel DP on which an image is not displayed. In an embodiment, the color at the second interface SC2 may be checked by an external inspection apparatus. In one embodiment, for example, the external inspection apparatus may be a microscope. However, embodiments of the invention are not limited thereto. Various inspection apparatuses may be used as the external inspection apparatus.

Both the driving bump DC-BP and the driving signal pad DP-PD may include a metal material. After the ultrasonic vibration is applied to the first interface SC1, a contact surface between the driving bump DC-BP and the driving signal pad DP-PD maintains or shows a same or constant color regardless of the bonding state (or the bonding strength).

However, when the ultrasonic vibration is applied to the second interface SC2, a color of the third insulating layer 30 may be changed by the friction between the third insulating layer 30 and the second portion of the driving bump DC-BP. In such an embodiment, the color of the third insulating layer 30 may be changed depending on a bonding state (or a bonding strength) between the third insulating layer 30 and the second portion of the driving bump DC-BP. In one embodiment, for example, the bonding strength may decrease as the color of the third insulating layer 30 becomes progressively darker, and the bonding strength may increase as the color of the third insulating layer 30 becomes progressively brighter.

Thus, in an embodiment, the bonding state (or the bonding strength) between the driving bump DC-BP and the driving signal pad DP-PD may be determined by checking the color at the second interface SC2 to which the ultrasonic vibration is applied.

If a portion of the driving bump DC-BP not overlapping with the driving signal pad DP-PD is too small, the color at the second interface SC2 provided with the ultrasonic vibration may not be effectively checked. Accordingly, in an embodiment of the invention, the driving bump DC-BP may be aligned with the driving signal pad DP-PD in such a way that an area of the driving bump DC-BP not overlapping with the driving signal pad DP-PD is in a range from about 10% to about 90% of a total area of the driving bump DC-BP in a plan view, i.e., when viewed from a top plan view or a plain view in a thickness direction of the substrate SUB. In such an embodiment of the invention, the driving bump DC-BP and the driving signal pad DP-PD are bonded to each other by the ultrasonography method, not a conductive member (e.g., an anisotropic conductive film). Thus, conductivity between the driving bump DC-BP and the driving signal pad DP-PD may be increased or improved.

As a result, in an embodiment, the area of the driving bump DC-BP not overlapping with the driving signal pad DP-PD is in a range from 10% to 90% of the total area of the driving bump DC-BP in a plan view as described above, such that the color at the second interface SC2 may be effectively checked. In such an embodiment, an overlapping area of the third insulating layer 30 and the driving bump DC-BP may be in a range from about 10% to about 90% of the total area of the driving bump DC-BP such that the color at the second interface SC2 may be effectively checked.

In an embodiment of the invention, the driving bump DC-BP may be aligned with a first pad portion of the pad portions DL-P in such a way that an area of the driving bump DC-BP not overlapping with the first pad portion is in a range from about 10% to about 90% of the total area of the driving bump DC-BP in a plan view. Since the area of the driving bump DC-BP not overlapping with the pad portion DL-P is in a range from about 10% to about 90% of the total area of the driving bump DC-BP in a plan view, the color at the second interface SC2 may be effectively checked.

Referring to FIG. 7E, a color at the first interface SC1 in the contact area CTA and a color at the second interface SC2 in the non-contact area NCTA are shown. The shape of FIG. 7E may be an image viewed in a direction from the substrate SUB of FIG. 7D toward the circuit substrate DC-PB of FIG. 7D.

As shown in FIG. 7E, the second interface SC2 in the non-contact area NCTA may have a color after the driving bump DC-BP is bonded to the third insulating layer 30 by the ultrasonic vibration. In FIG. 7E, the color of the first interface SC1 in the contact area CTA may not be effectively checked due to the driving signal pad DP-PD, such that a color of the driving signal pad DP-PD in the contact area CTA may be checked.

Thus, the bonding state (or the bonding strength) between the driving bump DC-BP and the driving signal pad DP-PD may be determined by checking the color of the second interface SC2 in the non-contact area NCTA.

Figure 8A:
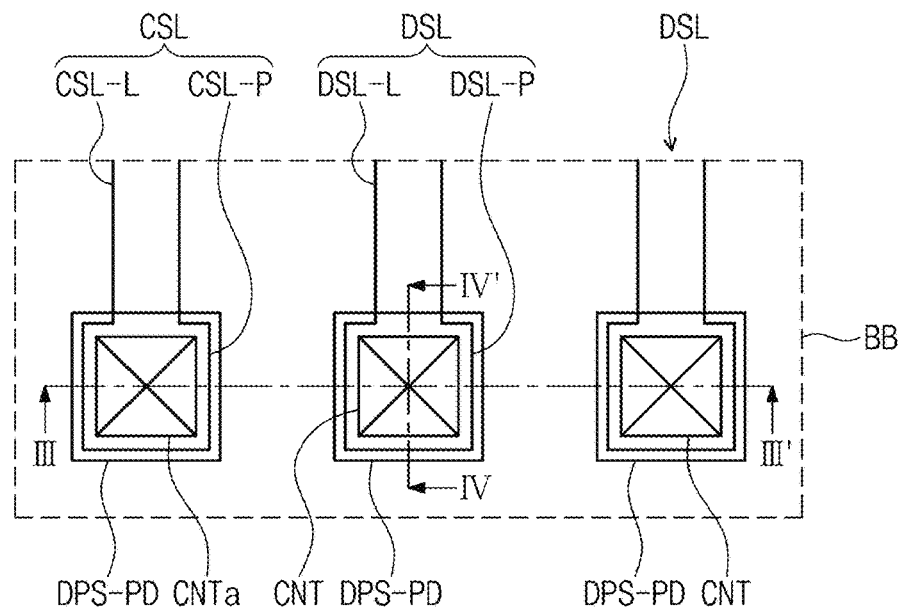
FIG. 8A is an enlarged view of an area BB of FIG. 4.
Figure 8B:
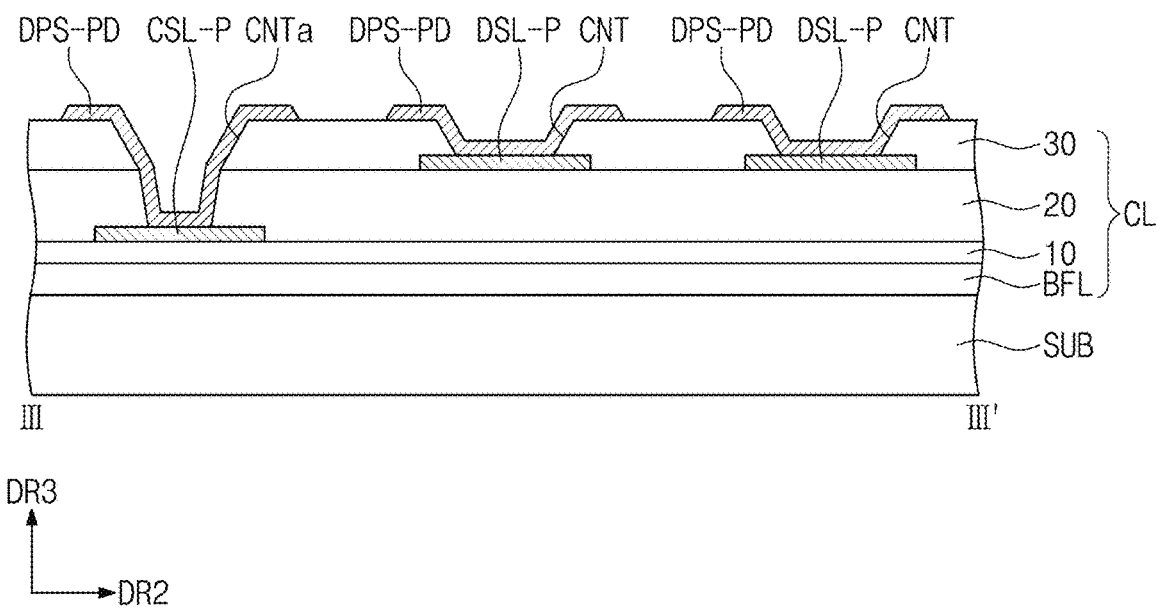
FIG. 8B is a cross-sectional view taken along line III-III' of FIG. 8A.
Figure 8C:
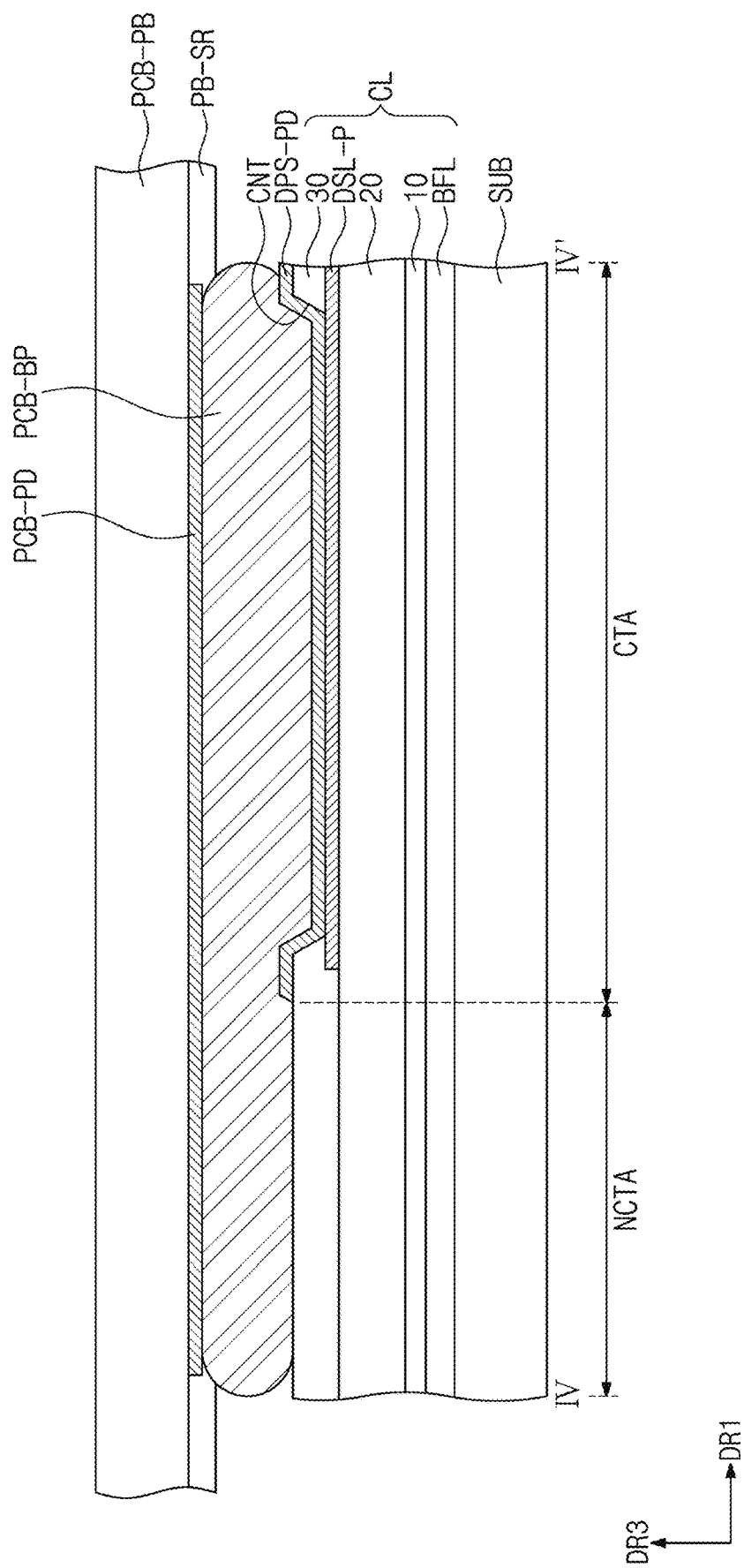
FIG. 8C is a cross-sectional view taken along line IV-IV' of FIG. 8A.
Figure 8D:
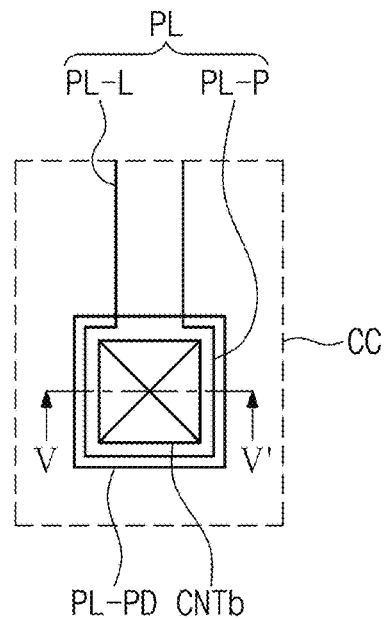
FIG. 8D is an enlarged view of an area CC of FIG. 4.
Figure 8E:
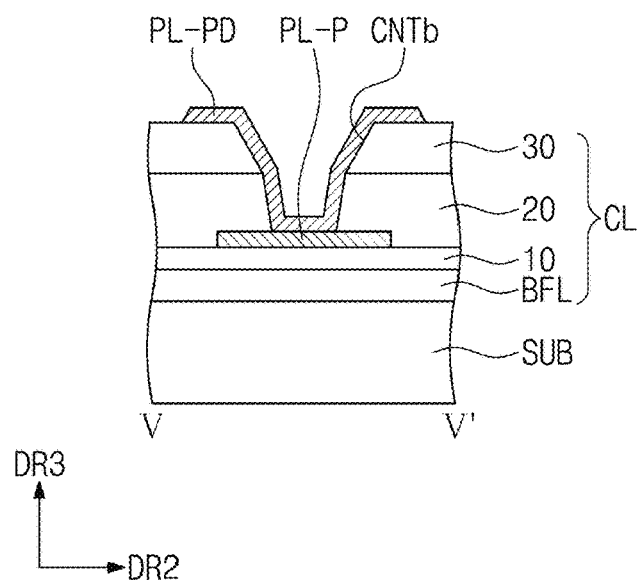
FIG. 8E is a cross-sectional view taken along line V-V' of FIG. 8D.

FIG. 8A is an enlarged view of an area BB of FIG. 4. FIG. 8B is a cross-sectional view taken along line III-III' of FIG. 8A. FIG. 8C is a cross-sectional view taken along line IV-IV' of FIG. 8A. FIG. 8D is an enlarged view of an area CC of FIG. 4. FIG. 8E is a cross-sectional view taken along line V-V' of FIG. 8D.

FIG. 8A illustrates a control signal line CSL and connection signal lines DSL, which are connected to the printed circuit board pads DPS-PDz in the connection pad area NDA-PC. The control signal line CSL and the connection signal lines DSL include connection line portions CSL-L and DSL-L and connection pad portions CSL-P and DSL-P.

An area per unit length of each of the connection pad portions CSL-P and DSL-P may be greater than an area per unit length of each of the connection line portions CSL-L and DSL-L. In an embodiment, the connection pad portions CSL-P and DSL-P have quadrilateral shapes in FIG. 8A. However, the shapes of the connection pad portions CSL-P and DSL-P may be variously modified or changed in manufacturing processes.

The connection line portion CSL-L of the control signal line CSL is connected to the driving circuit GDC (see FIG. 4), and the connection line portions DSL-L of the connection signal lines DSL are electrically connected to the first driving signal pads DP-PD1 (see FIG. 4), respectively.

In an embodiment, as illustrated in FIG. 8B, the connection pad portion CSL-P of the control signal line CSL may be disposed on the first insulating layer 10, and the connection pad portions DSL-P of the connection signal lines DSL may be disposed on the second insulating layer 20. The third insulating layer 30 may cover the connection pad portions DSL-P of the connection signal lines DSL.

According to an embodiment, the connection signal pads DPS-PD may be disposed on the third insulating layer 30. In such an embodiment, the connection pad portion CSL-P of the control signal line CSL may be connected to one of the connection signal pads DPS-PD through a contact hole CNTa defined through the second and third insulating layers 20 and 30.

According to an embodiment, the connection pad portions DSL-P of the connection signal lines DSL may be connected to corresponding ones of the connection signal pads DPS-PD through contact holes CNT defined in the third insulating layer 30.

According to an embodiment, as described above, the number of the insulating layers, through which the contact hole is defined, may be determined depending on a position of the pad portion of the signal line in a cross-sectional view. Although not shown in the drawings, the pad portion of the scan line may be disposed in a same layer as the connection pad portion CSL-P of the control signal line CSL and may be connected to a corresponding signal pad.

According to an embodiment, as illustrated in FIG. 8C, the printed circuit board PCB includes a first circuit substrate PCB-PB, a first circuit pad PCB-PD disposed on the first circuit substrate PCB-PB, and first solder paste PB-SR disposed on the first circuit substrate PCB-PB to expose the first circuit pad PCB-PD. Although not shown in the drawings, the first circuit pad PCB-PD may include a plurality of first circuit pads respectively corresponding to connection bumps PCB-BP. Each of the connection bumps PCB-BP is disposed on a corresponding one of the first circuit pads and is electrically connected to the one first circuit pad PCB-PD.

According to an embodiment of the invention, the connection bump PCB-BP may be aligned with the connection signal pad DPS-PD in such a way that an area of the connection bump PCB-BP not overlapping with the connection signal pad DPS-PD is in a range from 10% to 90% of a total area of the connection bump PCB-BP in a plan view. Thus, an entire bottom surface of the connection bump PCB-BP may not be in contact with the connection signal pad DPS-PD, but only a portion of the connection bump PCB-BP may be in electrical contact with the connection signal pad DPS-PD.

In such an embodiment, a bonding structure between the connection bump PCB-BP of the printed circuit board PCB and the connection signal pad DPS-PD in FIG. 8C may be substantially the same as the bonding structure between the driving chip DC and the driving signal pad DP-PD in FIG. 7D, and thus any repetitive detailed descriptions thereof will be omitted.

In such an embodiment, the connection bump PCB-BP may be electrically connected to the connection signal pad DPS-PD only in a contact area CTA. In such an embodiment, as described above, a bonding state (or a bonding strength) between the connection bump PCB-BP and the connection signal pad DPS-PD in the contact area CTA may be checked based on a color at an interface between the connection bump PCB-BP and the third insulating layer 30 in a non-contact area NCTA, to which ultrasonic vibration is applied.

Referring to FIGS. 8D and 8E, in an embodiment, a pad portion PL-P of the pad portions overlapping with the driving pad area NDA-DC may be disposed on the first insulating layer 10, unlike the pad portions DL-P of the data lines DL disposed on the second insulating layer 20. In such an embodiment, the pad portion PL-P may be connected to another line portion, not the line portion DL-L of the data line DL. In one embodiment, for example, the pad portion PL-P may be connected to the line portion PL-L of the power line PL for providing driving power to the pixels.

A power signal pad PL-PD may be disposed on the third insulating layer 30. The power signal pad PL-PD may be connected to the pad portion PL-P through a contact hole CNTb defined through the second and third insulating layers 20 and 30.

Figure 9C:
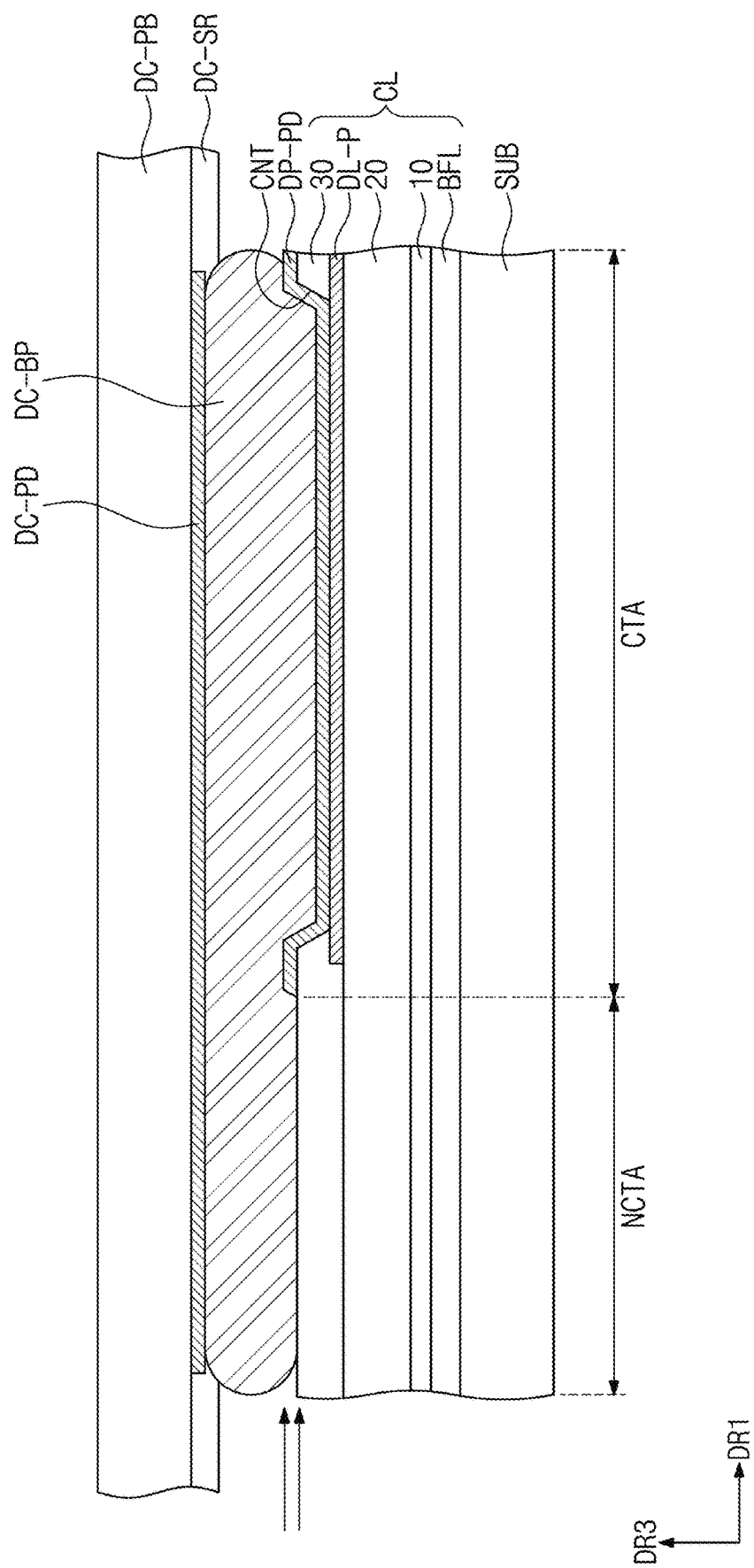

FIGS. 9A to 9C are cross-sectional views illustrating a method for manufacturing a display device according to an embodiment of the invention.

FIGS. 9A to 9C illustrates an embodiment of a method for bonding an electronic component (e.g., the driving chip or the printed circuit board) and the display panel DP including the driving signal pad DP-PD described above with reference to FIG. 7D. Hereinafter, an exemplary embodiment of a method for bonding the driving chip DC and the display panel DP will be described with reference to FIGS. 9A to 9C.

In such an embodiment, as illustrated in FIG. 9A, the display panel DP including the driving signal pad DP-PD and the driving chip DC including the driving bump DC-BP are provided. In such an embodiment, as described above, the driving bump DC-BP may be included in the driving chip DC as a single unitary body or may be provided as an individual component disposed on the driving chip DC.

An area of the driving bump DC-BP of the driving chip DC may be greater than an area of the driving signal pad DP-PD when viewed in a plan view. In such an embodiment, the driving bump DC-BP may be aligned with the driving signal pad DP-PD in such a way that an area of the driving bump DC-BP not overlapping with the driving signal pad DP-PD is in a range from about 10% to about 90% of a total area of the driving bump DC-BP in a plan view.

Thereafter, as illustrated in FIG. 9B, the driving bump DC-BP comes in contact with the driving signal pad DP-PD, and then, the driving bump DC-BP is compressed in a direction which is toward the substrate SUB or a direction parallel to the third direction DR3.

Subsequently, as illustrated in FIG. 9C, ultrasonic vibration may be applied to a first interface between the driving signal pad DP-PD and the driving bump DC-BP overlapping with the contact area CTA and a second interface between the third insulating layer 30 and the driving bump DC-BP overlapping with the non-contact area NCTA. In such an embodiment, the ultrasonic vibration may be applied to the first and second interfaces in the first direction DR1 corresponding to a side direction of the substrate SUB.

As a result, frictional heat may be generated at the first and second interfaces such that the driving bump DC-BP and the driving signal pad DP-PD are bonded to each other.

Figure 10A:
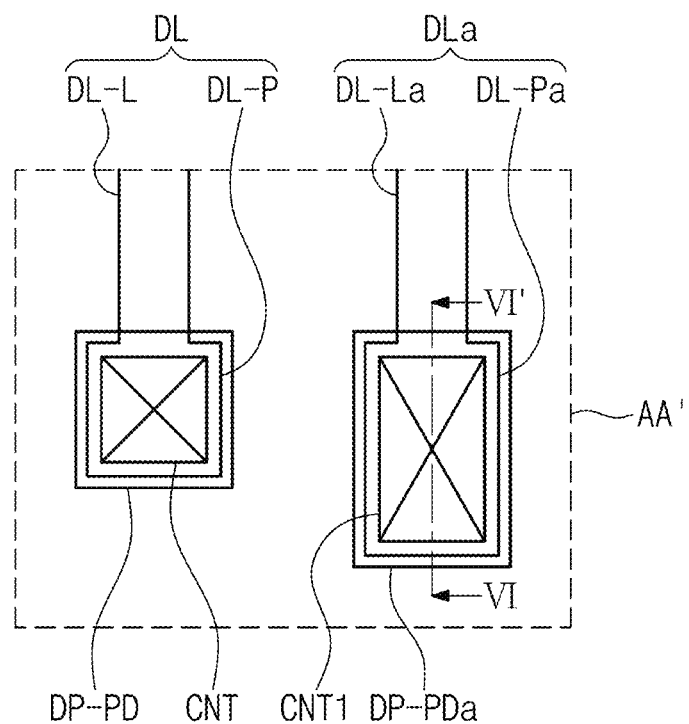
FIG. 10A is an enlarged view of an area AA' corresponding to the area AA of FIG. 4 to illustrate a display panel according to an alternative embodiment of the invention.
Figure 10B:
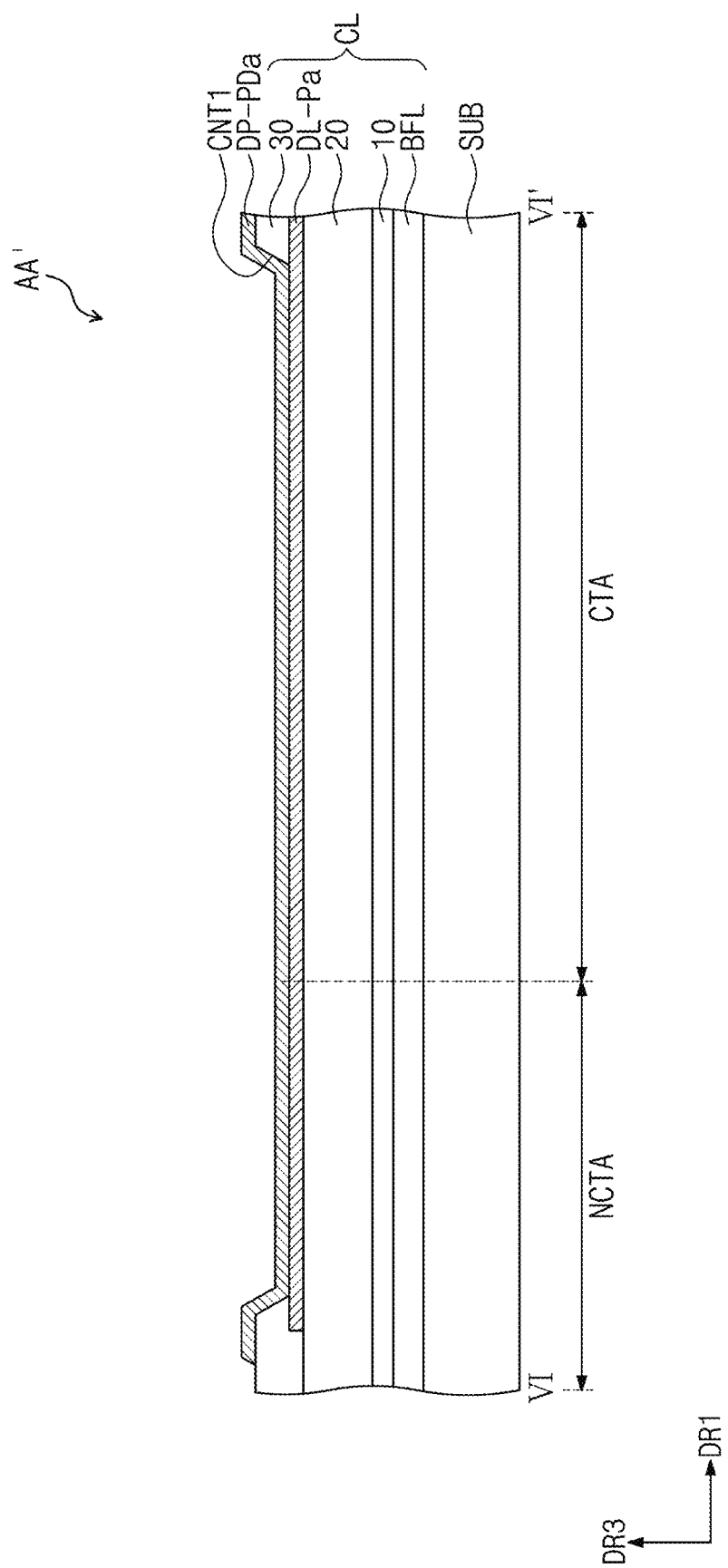
FIG. 10B is a cross-sectional view taken along line VI-VI' of FIG. 10A.

FIG. 10A is an enlarged view of an area AA' corresponding to the area AA of FIG. 4 to illustrate a display panel according to an alternative embodiment of the invention. FIG. 10B is a cross-sectional view taken along line VI-VI' of FIG. 10A.

Referring to FIGS. 10A and 10B, two data lines (i.e., first and second data lines DL and DLa) are illustrated. The first data line DL has the same structure as the data line DL illustrated in FIG. 7A, and thus any repetitive detailed descriptions thereof will be omitted.

In an embodiment, as shown in FIG. 10A, the second data line DLa includes a line portion DL-La and a pad portion DL-Pa. The line portion DL-La of the second data line DLa may have the same structure as the line portion DL-L of the first data line DL. In such an embodiment, an area of the pad portion DL-Pa of the second data line DLa may be greater than that of the pad portion DL-P of the first data line DL. In such an embodiment, an area of a driving signal pad DP-PDa illustrated in FIG. 10B may be greater than that of the driving signal pad DP-PD illustrated in FIG. 7D.

In such an embodiment, the driving signal pad DP-PDa may be connected to the driving bump DC-BP in the contact area CTA and the non-contact area NCTA. In such an embodiment, the driving signal pad DP-PDa may be connected to the pad portion DL-Pa through a contact hole CNT1 defined through the third insulating layer 30.

According to an embodiment of the invention, the driving signal pads DP-PD and the connection signal pads DPS-PD may have the structure of the driving signal pad DP-PD illustrated in FIG. 7D.

According to an alternative embodiment of the invention, the driving signal pads DP-PD illustrated in FIG. 7D and the driving signal pads DP-PDa illustrated in FIG. 10B may be alternately arranged in the driving pad area NDA-DC.

In one embodiment, for example, the driving signal pads may include first to fourth signal pads sequentially arranged, the first and third signal pads may have the structure of the driving signal pad DP-PD illustrated in FIG. 7D, and the second and fourth signal pads may have the structure of the driving signal pad DP-PDa illustrated in FIG. 10B.

Figure 11A:
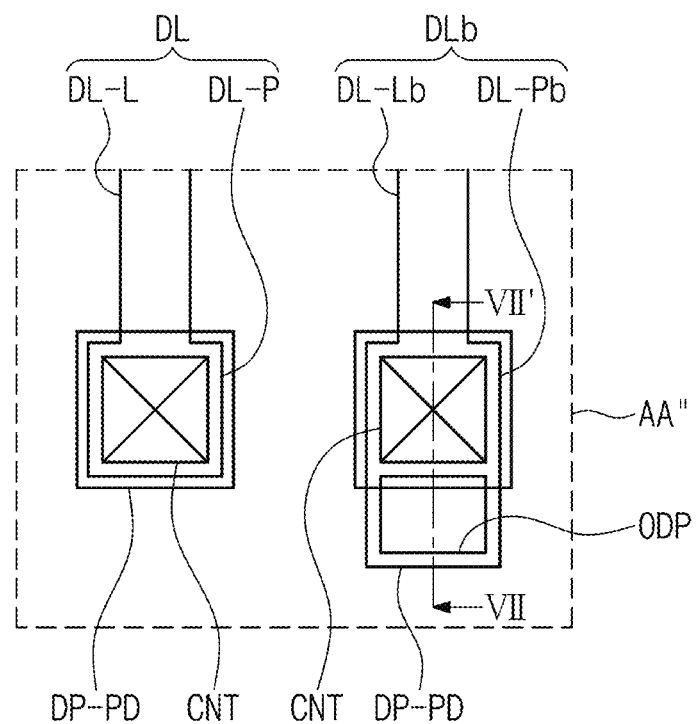
FIG. 11A is an enlarged view of an area AA" corresponding to the area AA of FIG. 4 to illustrate a display panel according to another alternative embodiment of the invention.
Figure 11B:
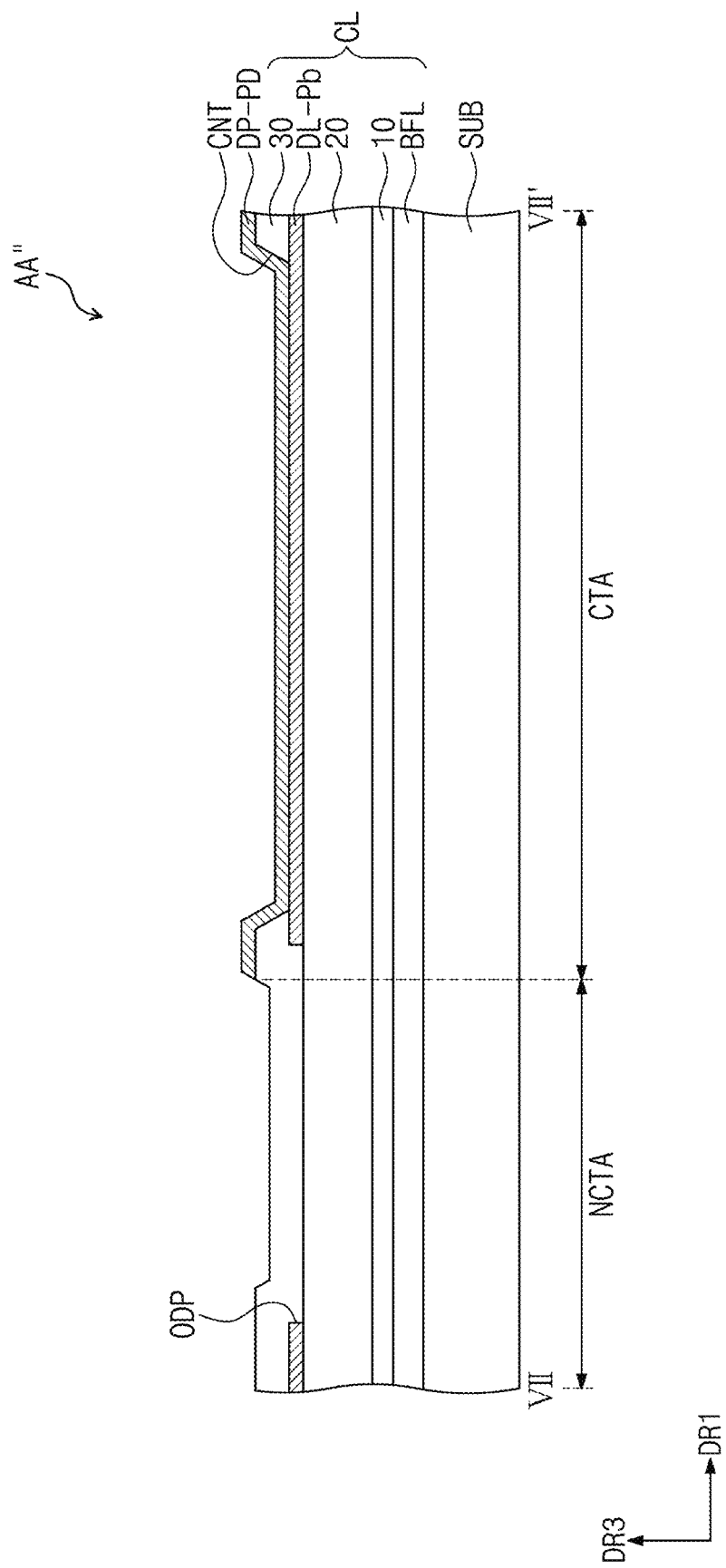
FIG. 11B is a cross-sectional view taken along line VII-VII' of FIG. 11A.

FIG. 11A is an enlarged view of an area AA" corresponding to the area AA of FIG. 4 to illustrate a display panel according to another alternative embodiment of the invention. FIG. 11B is a cross-sectional view taken along line VII-VII' of FIG. 11A.

Referring to FIGS. 11A and 11B, two data lines (i.e., first and second data lines DL and DLb) are illustrated. The first data line DL has the same structure as the data line DL illustrated in FIG. 7A, and thus any repetitive detailed descriptions thereof will be omitted.

In an embodiment, as shown in FIG. 11A, the second data line DLb includes a line portion DL-Lb and a pad portion DL-Pb. The line portion DL-Lb of the second data line DLb may have the same structure as the line portion DL-L of the first data line DL. In such an embodiment, an area of the pad portion DL-Pb of the second data line DLb may be greater than that of the pad portion DL-P of the first data line DL.

According to an embodiment, the pad portion DL-Pb may include a first pad part and a second pad part. The first pad part may overlap with the contact area CTA and may be disposed on the second insulating layer 20. The second pad part may overlap with the non-contact area NCTA and may be disposed on the second insulating layer 20. In an embodiment, as shown in FIG. 11B, An opening ODP may be defined in at least an area of the second pad part. In such an embodiment, when the color of the second interface SC2 is checked after applying the ultrasonic vibration as described above, the color of the second interface SC2 may be further effectively checked through the opening ODP.

Figure 12:
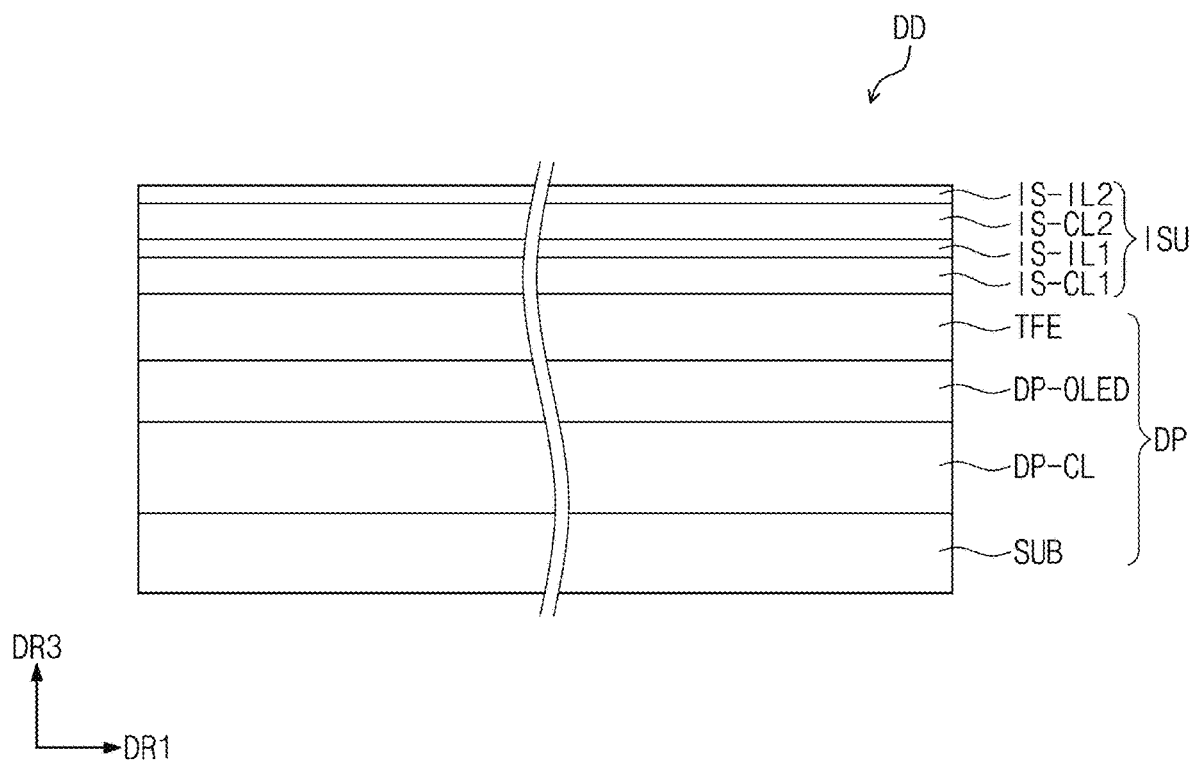
FIG. 12 is a cross-sectional view illustrating a display device according to an embodiment of the invention.
Figure 13:
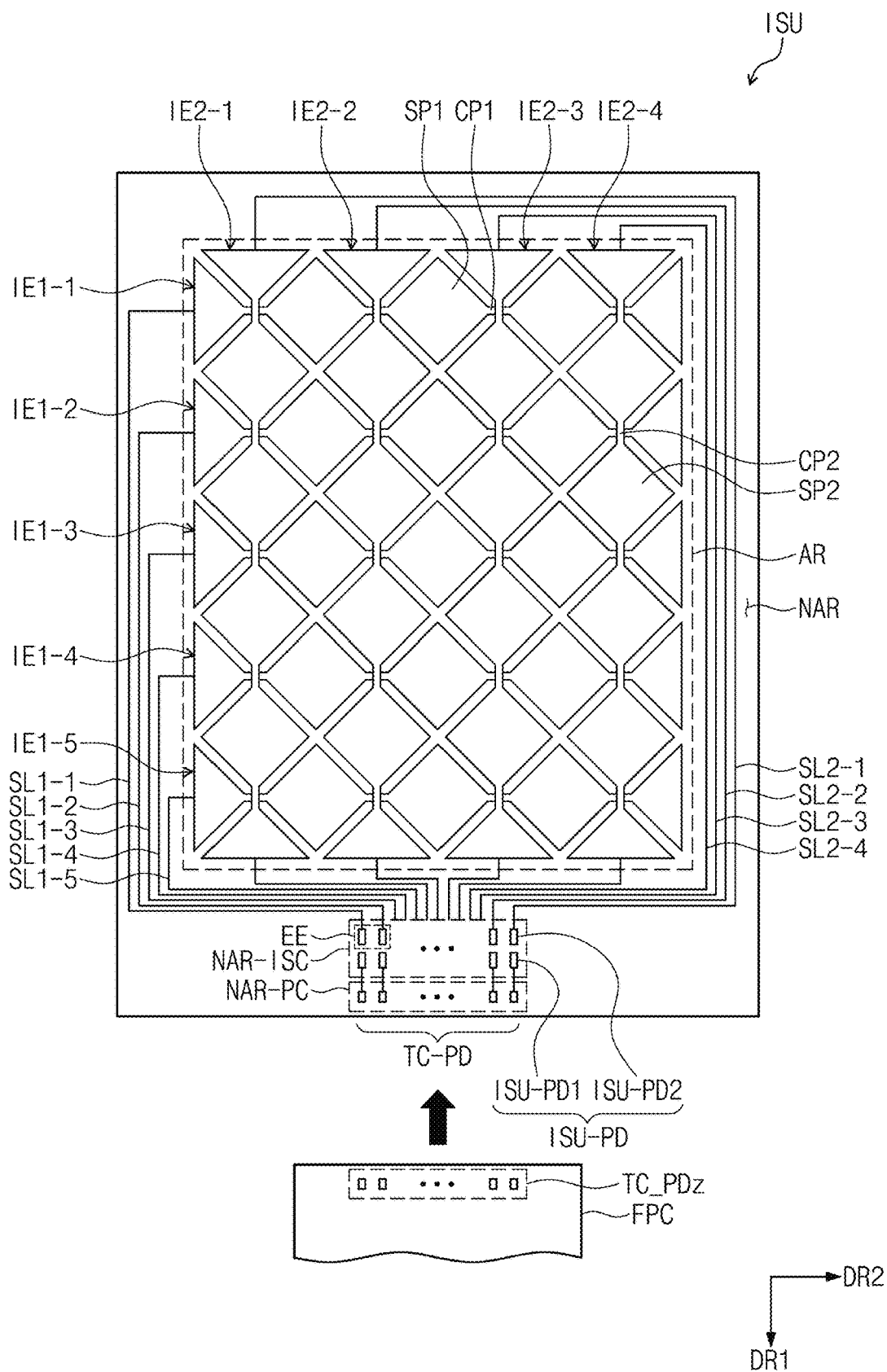
FIG. 13 is a plan view illustrating an input sensing unit according to an embodiment of the invention.

FIG. 12 is a cross-sectional view illustrating a display device according to an embodiment of the invention. FIG. 13 is a plan view illustrating an input sensing unit according to an embodiment of the invention.

Referring to FIG. 12, an embodiment of the display device includes a display panel DP and an input sensing unit ISU disposed on the display panel DP. In such an embodiment, the display panel DP may include a substrate SUB, a circuit layer DP-CL, a display element layer DP-OLED, and a thin film encapsulation layer TFE. IN such an embodiment, the input sensing unit ISU may include a first conductive layer IS-CL1, a first input sensing insulating layer IS-IL1 disposed on the first conductive layer IS-CL1, a second conductive layer IS-CL2 disposed on the first input sensing insulating layer IS-IL1, and a second input sensing insulating layer IS-IL2 disposed on the second conductive layer IS-CL2. Each of the first and second conductive layers IS-CL1 and IS-CL2 may have a single-layered structure or may have a multi-layered structure including a plurality of layers stacked along the third direction DR3.

Each of the first and second conductive layers IS-CL1 and IS-CL2 includes a plurality of patterns. The first conductive layer IS-CL1 includes first conductive patterns, and the second conductive layer IS-CL2 includes second conductive patterns. The first conductive patterns may include input sensing electrodes and signal lines, and the second conductive patterns may include input sensing electrodes and signal lines.

Referring to FIG. 13, the input sensing unit ISU may include an active area AR corresponding to the display area DD-DA of FIG. 4 and sensing an external input, and a non-active area NAR surrounding the active area AR. The printed circuit board PCB may include printed circuit board pads TC-PDz electrically connected to the input sensing unit ISU.

In an embodiment, as shown in FIG. 13, the input sensing unit ISU may include first sensing electrodes IE1-1 to IE1-5, first signal lines SL1-1 to SL1-5 connected to the first sensing electrodes IE1-1 to IE1-5, second sensing electrodes IE2-1 to IE2-4, and second signal lines SL2-1 to SL2-4 connected to the second sensing electrodes IE2-1 to IE2-4.

The first sensing electrodes IE1-1 to IE1-5 intersect the second sensing electrodes IE2-1 to IE2-4. The first sensing electrodes IE1-1 to IE1-5 are arranged in the first direction DR1, and each of the first sensing electrodes IE1-1 to IE1-5 extends in the second direction DR2. An external input, e.g., a touch thereon, may be sensed by a mutual capacitance method and/or a self-capacitance method. Coordinates of the external input may be calculated during a first period by the mutual capacitance method, and then, the coordinates of the external input may be re-calculated during a second period by the self-capacitance method.

Each of the first sensing electrodes IE1-1 to IE1-5 includes first sensor parts SP1 and first connection parts CP1. Each of the second sensing electrodes IE2-1 to IE2-4 includes second sensor parts SP2 and second connection parts CP2. Sizes of two first sensor parts SP1 disposed at both ends of each of the first sensing electrodes IE1-1 to IE1-5 may be smaller than a size of a first sensor part SP1 disposed at a center of each of the first sensing electrodes IE1-1 to IE1-5. In one embodiment, for example, the sizes of the two first sensor parts SP1 disposed at the both ends may be equal to a half of the size of the first sensor part SP1 disposed at the center. Sizes of two second sensor parts SP2 disposed at both ends of each of the second sensing electrodes IE2-1 to IE2-4 may be smaller than a size of a second sensor part SP2 disposed at a center of each of the second sensing electrodes IE2-1 to IE2-4. In one embodiment, for example, the sizes of the two second sensor parts SP2 disposed at the both ends may be equal to a half of the size of the second sensor part SP2 disposed at the center.

However, embodiments of the invention are not limited to the shapes of the first and second sensing electrodes IE1-1 to IE1-5 and IE2-1 to IE2-4 illustrated in FIG. 13. In an alternative embodiment of the invention, each of the first and second sensing electrodes IE1-1 to IE1-5 and IE2-1 to IE2-4 may have a shape (e.g., a bar shape) without distinction between a sensor part and a connection part. FIG. 13 shows an embodiment where the first sensor parts SP1 and the second sensor parts SP2 having diamond shapes. However, embodiments of the invention are not limited thereto. In an alternative embodiment, the first sensor parts SP1 and the second sensor parts SP2 may have another polygonal shape.

The first signal lines SL1-1 to SL1-5 and the second signal lines SL2-1 to SL2-4 may overlap with the non-active area NAR, and each of the first and second signal lines SL1-1 to SL1-5 and SL2-1 to SL2-4 may include a pad portion and a line portion. The line portion overlaps with the non-active area NAR and is connected to the input sensing electrode and the pad portion. Hereinafter, the first signal lines SL1-1 to SL1-5 and the second signal lines SL2-1 to SL2-4 will be referred to as signal lines SL.

The pad portion overlaps with a corresponding one of input sensing signal pads ISU-PD. An area of the non-active area NAR, in which the input sensing signal pads ISU-PD are disposed, may be defined as a sensing pad area NAR-ISC.

The input sensing signal pads ISU-PD include a plurality of first input sensing signal pads ISU-PD1 and a plurality of second input sensing signal pads ISU-PD2. The first input sensing signal pads ISU-PD1 electrically connect connection signal pads TC-PD to first bumps ISC-BP1 disposed on an input sensing driving chip ISC (see FIG. 14C). The second input sensing signal pads ISU-PD2 electrically connect second bumps ISC-BP2 to the signal lines SL.

According to an embodiment, the input sensing driving chip ISC (see FIG. 14C) may be mounted on the sensing pad area NAR-ISC. In such an embodiment, the input sensing signal pads ISU-PD are electrically connected to the input sensing driving chip ISC to transmit electrical signals received from the input sensing driving chip ISC to the signal lines SL.

In such an embodiment, connection signal lines for connecting the input sensing signal pads ISU-PD and the connection signal pads TC-PD may be disposed in the non-active area NAR. Each of the connection signal lines may include a connection pad portion and a connection line portion.

The connection pad portions are connected to ends of the connection line portions, respectively. The connection pad portion overlaps with a corresponding one of the connection signal pads TC-PD. An area in which the connection signal pads TC-PD are disposed may be defined as a connection pad area NAR-PC.

According to an embodiment of the invention, an area of a flexible printed circuit board FPC may be disposed on the connection pad area NAR-PC. In such an embodiment, the connection signal pads TC-PD may be electrically connected to the flexible printed circuit board FPC to transmit electrical signals received from the flexible printed circuit board FPC to the input sensing signal pads ISU-PD.

Figure 14A:
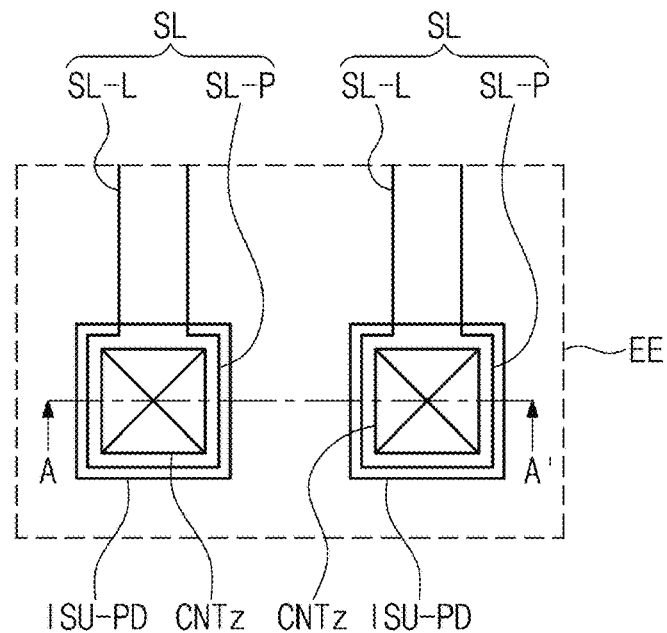
FIG. 14A is an enlarged view of an area EE of FIG. 13.
Figure 14B:
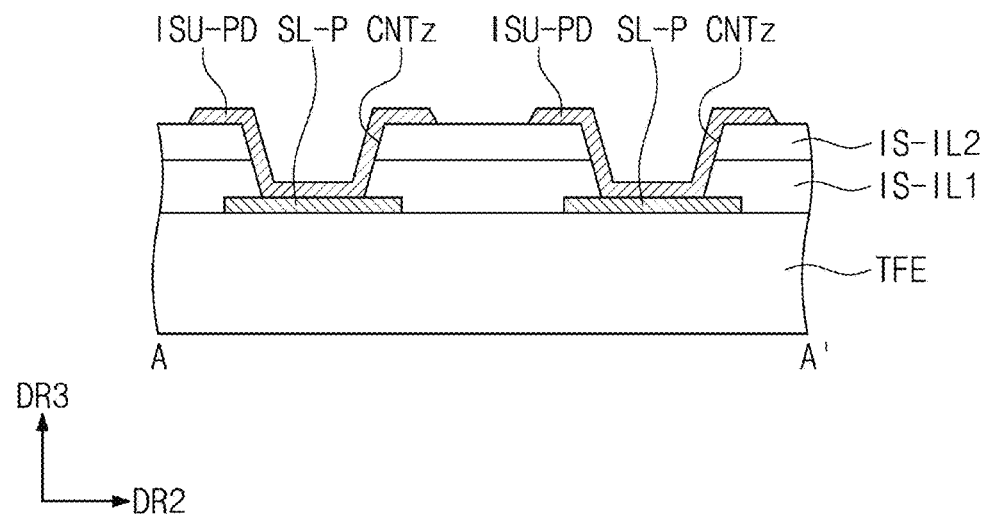
FIG. 14B is a cross-sectional view taken along line A-A' of FIG. 14A.
Figure 14C:
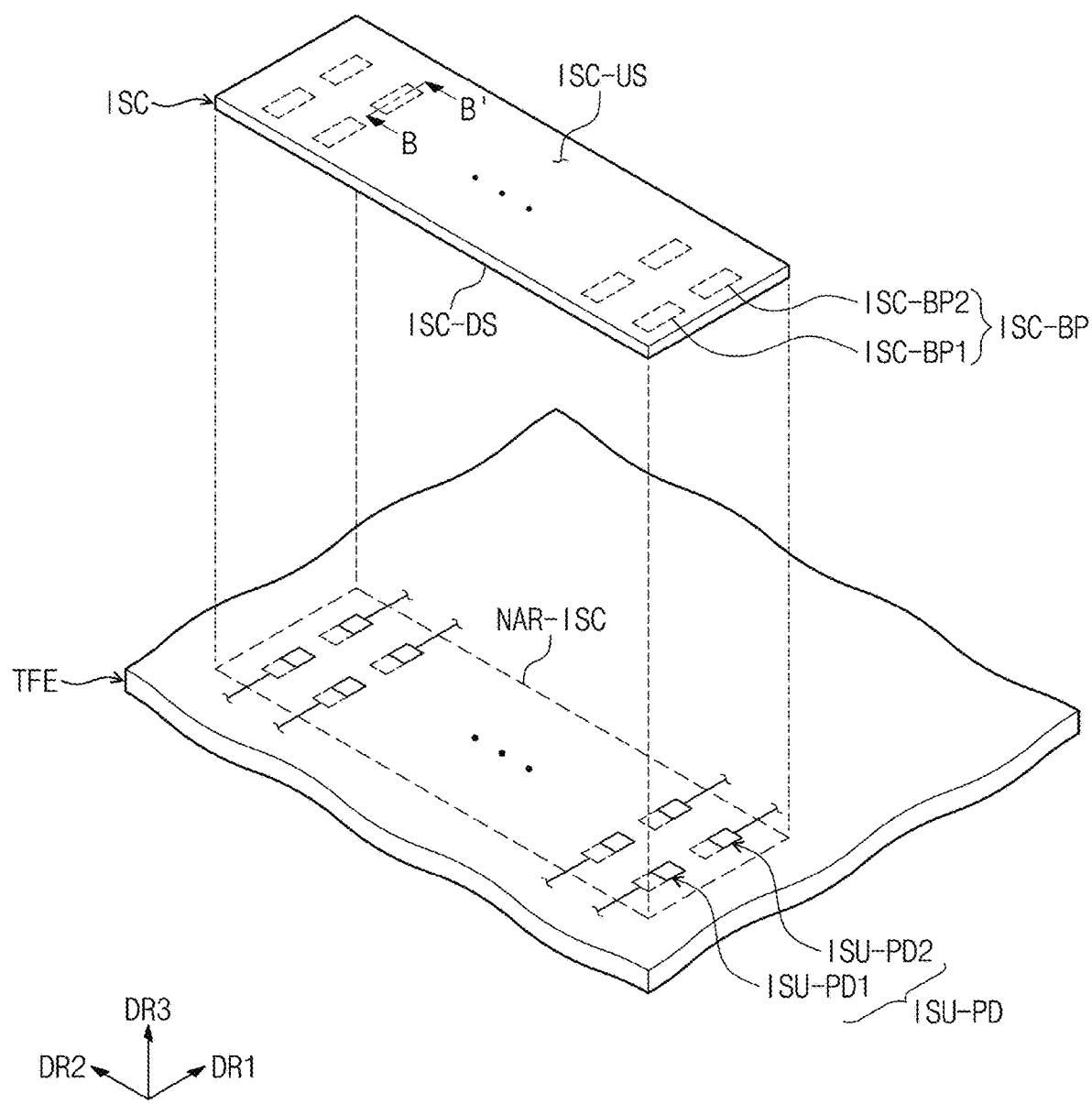
FIG. 14C is an exploded perspective view illustrating an input sensing driving chip and an encapsulation substrate according to an embodiment of the invention.
Figure 14D:
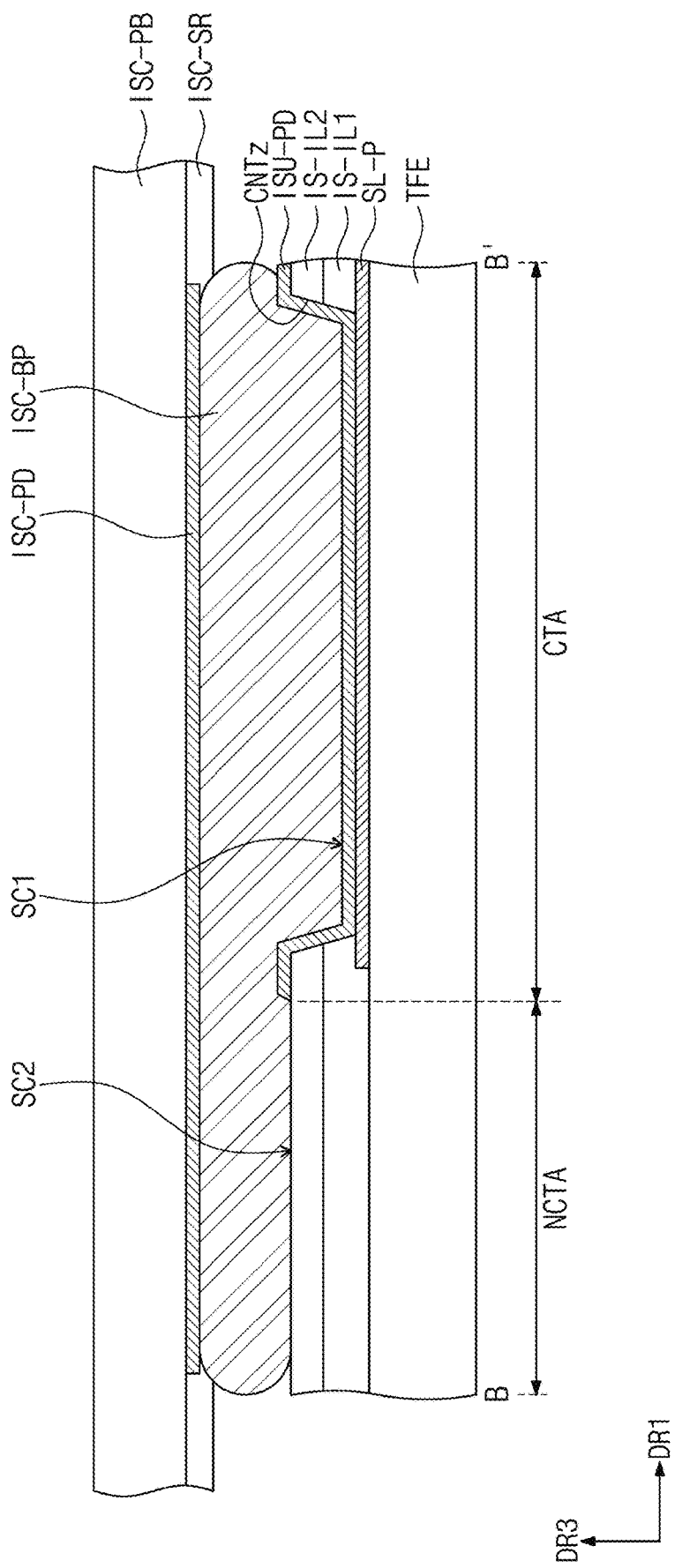
FIG. 14D is a cross-sectional view taken along line B-B' of FIG. 14C to illustrate a display device according to an embodiment of the invention.
Figure 14E:
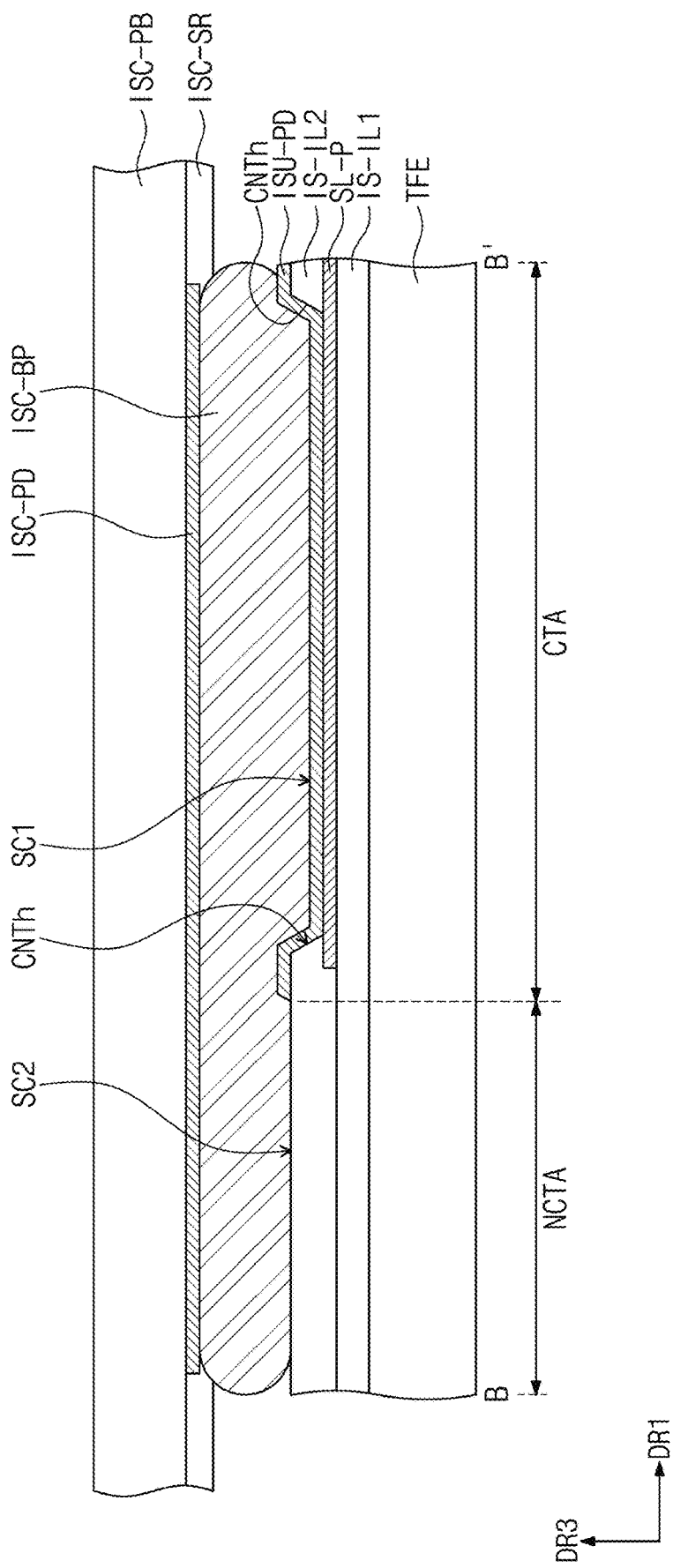
FIG. 14E is a cross-sectional view taken along the line B-B' of FIG. 14C to illustrate a display device according to an alternative embodiment of the invention.

FIG. 14A is an enlarged view of an area EE of FIG. 13. FIG. 14B is a cross-sectional view taken along line A-A' of FIG. 14A. FIG. 14C is an exploded perspective view illustrating an input sensing driving chip and an encapsulation substrate according to an embodiment of the invention. FIG. 14D is a cross-sectional view taken along line B-B' of FIG. 14C to illustrate a display device according to an embodiment of the invention. FIG. 14E is a cross-sectional view taken along the line B-B' of FIG. 14C to illustrate a display device according to an alternative embodiment of the invention.

FIG. 14A illustrates line portions SL-L and pad portions SL-P of two of the signal lines SL. In such an embodiment, as described above with reference to FIG. 13, the signal line SL includes the line portion SL-L and the pad portion SL-P. However, in an alternative embodiment, the line portion SL-L and the pad portion SL-P may be individually provided. In such an embodiment, the input sensing unit ISU may include signal lines SL corresponding to the line portions, and pads connected to the signal lines SL, respectively. In such an embodiment, the pads may correspond to the pad portions SL-P, respectively. In an embodiment of the invention, the signal line SL of FIG. 13 and the pad portion (or the pad) SL-P connected thereto may constitute a single unitary body or may be provided as individual components connected to each other.

An area per unit length of each of the pad portions SL-P may be greater than an area per unit length of each of the line portions SL-L. The pad portions SL-P have quadrilateral shapes as shown in FIG. 14A. However, the shapes of the pad portions SL-P may be variously modified or changed in manufacturing processes.

In an embodiment, as illustrated in FIG. 14B, the pad portions SL-P of the signal lines SL may be disposed on the thin film encapsulation layer TFE. The first input sensing insulating layer IS-IL1 may cover the pad portions SL-P of the signal lines SL. The second input sensing insulating layer IS-IL2 is disposed on the first input sensing insulating layer IS-IL1, and the input sensing signal pads ISU-PD are disposed on the second input sensing insulating layer IS-IL2.

Each of the input sensing signal pads ISU-PD is connected to a corresponding one of the pad portions SL-P. Each of the input sensing signal pads ISU-PD may be electrically connected to the corresponding pad portion SL-P through a contact hole CNTz defined through the first and second input sensing insulating layers IS-IL1 and IS-IL2.

Referring to FIG. 14C, the input sensing driving chip ISC may include a top surface ISC-US and a bottom surface ISC-DS, and may include a plurality of bumps ISC-BP disposed on the bottom surface ISC-DS. In an embodiment, the bumps ISC-BP may be provided as additional components for mounting the input sensing driving chip ISC on the sensing pad area NAR-ISC, the bumps ISC-BP may not be a component of the input sensing driving chip ISC.

The input sensing signal pads ISU-PD disposed on the thin film encapsulation layer TFE may include a plurality of first input sensing signal pads ISU-PD1 and a plurality of second input sensing signal pads ISU-PD2. The bumps ISC-BP disposed on the bottom surface ISC-DS of the input sensing driving chip ISC may include a plurality of first bumps ISC-BP1 and a plurality of second bumps ISC-BP2.

Referring to FIG. 14D, the input sensing driving chip ISC includes a circuit substrate ISC-PB, a circuit pad ISC-PD disposed on the circuit substrate ISC-PB, and solder paste ISC-SR disposed on the circuit substrate ISC-PB to expose the circuit pad ISC-PD. Although not shown in the drawings, the circuit pad ISC-PD may include a plurality of circuit pads corresponding to the bumps ISC-BP, respectively. Each of the bumps ISC-BP is disposed on a corresponding one of the circuit pads and is electrically connected to the one circuit pad ISC-PD.

A bonding structure between the input sensing signal pad ISU-PD and the bump ISC-BP of the input sensing driving chip ISC in FIG. 14D may be substantially the same as the bonding structure between the driving chip DC and the driving signal pad DP-PD in FIG. 7D, and thus any repetitive detailed descriptions thereof will be omitted.

In such an embodiment, the bump ISC-BP may be electrically connected to the input sensing signal pad ISU-PD only in a contact area CTA. In such an embodiment, as described above, a bonding state (or a bonding strength) between the bump ISC-BP and the input sensing signal pad ISU-PD in the contact area CTA may be checked based on a color at an interface between the bump ISC-BP and the second input sensing insulating layer IS-IL2 in a non-contact area NCTA, to which ultrasonic vibration is applied.

Referring to FIG. 14E, in an alternative embodiment of the invention, the pad portion SL-P of the signal line SL may be disposed on the first input sensing insulating layer IS-ILL not on the thin film encapsulation layer TFE. In such an embodiment, the input sensing signal pad ISU-PD may be connected to the pad portion SL-P through a contact hole CNTh defined through the second input sensing insulating layer IS-IL2.

Figure 15:
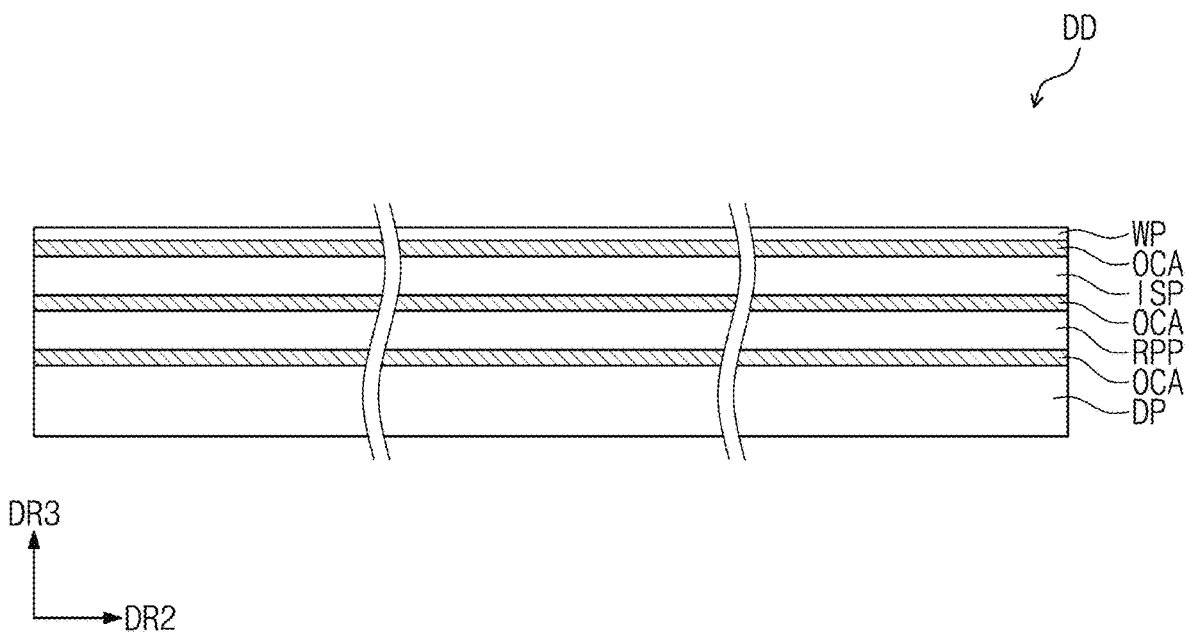
FIG. 15 is a cross-sectional view illustrating a display device according to another alternative embodiment of the invention.

FIG. 15 is a cross-sectional view illustrating a display device according to another alternative embodiment of the invention.

Referring to FIG. 15, an embodiment of a display device DD may include a display panel DP, an input sensing panel ISP, an anti-reflection panel RPP, a window panel WP, and an adhesive member OCA. In such an embodiment, a stacking order of the input sensing panel ISP and the anti-reflection panel RPP may be variously modified from that shown in FIG. 15.

In an embodiment of the display device DD of FIG. 15, the input sensing panel ISP and the display panel DP may be provided as individual components and may be coupled to each other by the adhesive member OCA.

In such an embodiment, the bonding structure between the bump and the signal pad of the display panel DP and the input sensing panel ISP illustrated in FIG. 15 may be the same as those described above.

According to an embodiment of the invention, a first portion of the bump disposed on the electronic component may be in direct contact with the signal pad disposed on the substrate, and a second portion of the bump may be in direct contact with the insulating layer. In such an embodiment, a bonding strength between the signal pad and the first portion of the bump may be checked based on a color at a contact surface between the insulating layer and the second portion of the bump.

According to an embodiment of the invention set forth herein, an electrical connection state between the substrate and the electronic component may be effectively checked, and overall driving reliability of the display device may be improved.

While the invention has been described with reference to example embodiments, it will be apparent to those skilled in the art that various changes and modifications may be made without departing from the spirits and scopes of the invention. Therefore, it should be understood that the above embodiments are not limiting, but illustrative. Thus, the scopes of the invention are to be determined by the broadest permissible interpretation of the following claims and their equivalents, and shall not be restricted or limited by the foregoing description.

What is claimed is:

1. A display device comprising:
   a substrate comprising a display area and a non-display area;
   driving elements disposed in the display area;
   a plurality of pads disposed in the non-display area and electrically connected to the driving elements;
   an insulating layer disposed on the pads, wherein each of the pads is partially exposed through the insulating layer;
   a plurality of signal pads disposed on the pads, respectively, wherein each of the signal pads is electrically connected to a corresponding pad among the pads; and
   an electronic component comprising a plurality of driving bumps disposed on the signal pads and electrically connected to the signal pads, respectively,
   wherein a first portion of a first driving bump of the driving bumps is in direct contact with a first signal pad of the signal pads, and
   wherein a second portion of the first driving bump is in direct contact with a portion of the insulating layer not overlapping with the first signal pad.

2. The display device of claim 1, wherein the first driving bump is aligned with the first signal pad in such a way that an area of the first driving bump not overlapping the first signal pad is in a range from about 10% to about 90% of a total area of the first driving bump in a plan view.

3. The display device of claim 1, wherein the first driving bump is aligned with a first pad of the pads in such a way that an area of the first driving bump not overlapping with the first pad is in a range from about 10% to about 90% of a total area of the first driving bump in a plan view.

4. The display device of claim 1, further comprising;
   another insulating layer disposed between the pads and the substrate.

5. The display device of claim 1, further comprising:
   another insulating layer disposed between a first pad of the pads and a second pad of the pads.

6. The display device of claim 1, wherein a structure of each of the signal pads is the same as a structure of the first signal pad.

7. The display device of claim 1, wherein the signal pads further comprise: a second signal pad in direct contact with both a first portion and a second portion of a second driving bump of the driving bumps.

8. The display device of claim 7, wherein
   the signal pads further comprise: a third signal pad and a fourth signal pad,
   the first to fourth signal pads are sequentially arranged,
   a structure of the third signal pad is the same as a structure of the first signal pad, and
   a structure of the fourth signal pad is the same as a structure of the second signal pad.

9. The display device of claim 1, wherein a first pad of the pads overlaps with the first portion of the first driving bump and does not overlap with the second portion of the first driving bump.

10. The display device of claim 1, wherein
    the pads comprise a first pad and a second pad,
    the first pad overlaps with the first portion of the first driving bump and does not overlap with the second portion of the first driving bump, and the second pad comprises:
a first pad part overlapping with a first portion of a second driving bump of the driving bumps; and
a second pad part overlapping with a second portion of the second driving bump.

11. The display device of claim 10, wherein
the second pad part is covered by the insulating layer, and
an opening is defined in at least an area of the second pad part.

12. The display device of claim 1, wherein
the driving elements comprise a plurality of pixels which displays an image, and
the display device further comprises:
a plurality of signal lines disposed on the substrate and connected between the pads to the pixels.

13. The display device of claim 12, wherein the electronic component comprises a data driving chip disposed on the non-display area.

14. The display device of claim 12, wherein the electronic component comprises a printed circuit board partially disposed on the non-display area.

15. The display device of claim 1, wherein
the driving elements comprise a plurality of input sensing electrodes, and
the display device further comprises:
a plurality of signal lines disposed on the substrate and connected between the pads to the input sensing electrodes.

16. The display device of claim 15, wherein the electronic component comprises an input sensing driving chip disposed on the non-display area.

17. The display device of claim 15, wherein the electronic component comprises a flexible printed circuit board partially disposed on the non-display area.

18. A method for manufacturing a display device, the method comprising:
providing a display panel comprising a signal pad;
aligning a bump, which has a greater planar area than the signal pad, of an electronic component with the signal pad of the display panel in such a way that an area of the bump not overlapping the signal pad is in a range from about 10% to about 90% of a total area of the bump in a plan view;
contacting the bump with the signal pad; and
applying ultrasonic vibration to the bump and the signal pad.

19. The method of claim 18, wherein the applying the ultrasonic vibration comprises:
applying the ultrasonic vibration to an interface between the bump and the signal pad.

20. An electronic panel comprising:
a substrate comprising a pad area;
a signal line, a portion of which is disposed in the pad area;
an insulating layer disposed on the substrate to expose the portion of the signal line which overlaps with the pad area;
a signal pad disposed on the insulating layer and electrically connected to the portion of the signal line; and
an electronic component comprising a driving bump disposed on the signal pad and electrically connected to the signal pad,
wherein a first portion of the driving bump is in direct contact with the signal pad, and
wherein a second portion of the driving bump is in direct contact with a portion of the insulating layer not overlapping with the signal pad.

* * * * *